(12) United States Patent
Komori et al.

(10) Patent No.: US 8,330,216 B2
(45) Date of Patent: Dec. 11, 2012

(54) NON-VOLATILE SEMICONDUCTOR MEMORY DEVICE AND METHOD OF MANUFACTURING THE SAME

(75) Inventors: Yosuke Komori, Yokohama (JP); Masaru Kito, Yokohama (JP); Megumi Ishiduki, Yokohama (JP); Ryota Katsumata, Yokohama (JP); Hiroyasu Tanaka, Tokyo (JP); Masaru Kidoh, Komae (JP); Yoshiaki Fukuzumi, Yokohama (JP); Hideaki Aochi, Kawasaki (JP); Yasuyuki Matsuoka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 364 days.

(21) Appl. No.: 12/345,088

(22) Filed: Dec. 29, 2008

(65) Prior Publication Data
US 2009/0179257 A1 Jul. 16, 2009

(30) Foreign Application Priority Data
Jan. 8, 2008 (JP) ..................................... 2008-1681

(51) Int. Cl.
*H01L 29/66* (2006.01)
(52) U.S. Cl. ................. 257/331; 257/314; 257/E27.009
(58) Field of Classification Search .................. 257/314, 257/331, E27.009
See application file for complete search history.

(56) References Cited

U.S. PATENT DOCUMENTS

| 2002/0195668 A1* | 12/2002 | Endoh et al. .................. 257/390 |
| 2007/0252201 A1 | 11/2007 | Kito et al. |
| 2008/0009134 A1* | 1/2008 | Hung et al. .................. 438/649 |

FOREIGN PATENT DOCUMENTS
JP 2007-266143 10/2007

* cited by examiner

*Primary Examiner* — Zandra Smith
*Assistant Examiner* — Jamie C Niesz
(74) *Attorney, Agent, or Firm* — Oblon, Spivak, McClelland, Maier & Neustadt, L.L.P.

(57) ABSTRACT

A non-volatile semiconductor memory device includes a first columnar semiconductor layer and a plurality of first conductive layers formed such that a charge storage layer for storing charges is sandwiched between the first conductive layers and the first columnar semiconductor layer. Also, the non-volatile semiconductor memory device includes a second columnar semiconductor layer and a second conductive layer formed such that an insulating layer is sandwiched between the second conductive layer and the second columnar semiconductor layer, the second conductive layer being repeatedly provided in a line form by providing a certain interval in a first direction perpendicular to a laminating direction. A first sidewall conductive layer being in contact with the second conductive layer and extending in the first direction is formed on a sidewall along a longitudinal direction of the second conductive layer.

11 Claims, 22 Drawing Sheets

NON-VOLATILE SEMICONDUCTOR MEMORY DEVICE AND METHOD OF MANUFACTURING THE SAME

CROSS REFERENCE TO RELATED APPLICATIONS

This application is based on and claims the benefit of priority from prior Japanese Patent Application No. 2008-1681, filed on Jan. 8, 2008, the entire contents of which are incorporated herein by reference.

BACKGROUND OF THE INVENTION

1. Field of the Invention

The present invention relates to a non-volatile semiconductor memory device in which data is electrically rewritable and a method of manufacturing the same.

2. Description of the Related Art

Conventionally, an LSI is formed by integrating elements in a two-dimensional plane on a silicon substrate. Generally, dimensions of one element are made smaller (dimensions made finer) to increase storage capacity of memory, but in recent years, making dimensions finer is becoming increasingly more difficult in terms of costs and technology. Technological improvement of photolithography is needed to implement finer dimensions, but costs required for a lithography process are ever on the rise. Moreover, even if finer dimensions are achieved, it is expected that physical limits such as breakdown voltage between elements are reached if, for example, the drive voltage is not scaled. That is, it is highly probable that operations as a device will be harder and harder.

Thus, in recent years, many semiconductor memory devices in which memory cells are three-dimensionally arranged have been proposed to increase the integration degree of memory (Japanese Patent Application Laid-Open No. 2007-266143). A non-volatile semiconductor memory device described in Japanese Patent Application Laid-Open No. 2007-266143 has conductive layers and interlayer insulating layers alternately laminated. The conductive layers are set to be a drain-side selection gate electrode, a word line, or a source-side selection gate electrode and the interlayer insulating layers are set to insulation-separate the conductive layers. Then, a hole is opened to form a columnar semiconductor, a tunnel insulating layer, a charge storage layer, a block insulating layer and the like therein.

However, misalignment may occur in a process in which a conductive layer to be a drain-side selection gate electrode and a source-side selection gate electrode are formed in a line form and then, a hole is opened. The misalignment leads to dispersion of characteristics of the selection gate electrodes. Moreover, resistance of the selection gate electrodes increases because the width of a conductive layer formed in a line form decreases due to the hole.

SUMMARY OF THE INVENTION

According to one aspect of the present invention, there is provided a non-volatile semiconductor memory device having a plurality of memory strings in which a plurality of memory cells that are electrically rewritable and a plurality of selection transistors are connected in series, the memory string includes: a first columnar semiconductor layer extending in a direction perpendicular to a substrate; a plurality of first conductive layers formed such that a charge storage layer for storing charges is sandwiched between the first conductive layers and the first columnar semiconductor layer; a second columnar semiconductor layer that is in contact with an upper side of the first columnar semiconductor layer and extends in the direction perpendicular to the substrate; and a second conductive layer formed such that an insulating layer is sandwiched between the second conductive layer and the second columnar semiconductor layer, the second conductive layer being repeatedly provided in a line form by providing a certain interval in a first direction perpendicular to a laminating direction, and a first sidewall conductive layer that is in contact with the second conductive layer and extends in the first direction is formed on a sidewall along a longitudinal direction of the second conductive layer.

According to another aspect of the present invention, there is provided a non-volatile semiconductor memory device having a plurality of memory strings in which a plurality of memory cells that are electrically rewritable and a plurality of selection transistors are connected in series, the memory string includes: a first columnar semiconductor layer extending in a direction perpendicular to a substrate; a plurality of first conductive layers formed such that a charge storage layer for storing charges is sandwiched between the first conductive layers and the first columnar semiconductor layer; a third columnar semiconductor layer that is in contact with an lower side of the first columnar semiconductor layer and extends in the direction perpendicular to the substrate; and a third conductive layer formed such that an insulating layer is sandwiched between the third conductive layer and the third columnar semiconductor layer, the third conductive layer being repeatedly provided in a line form by providing a certain interval in a first direction perpendicular to a laminating direction, and a second sidewall conductive layer that is in contact with the third conductive layer and extends in the first direction is formed on a sidewall along a longitudinal direction of the third conductive layer.

According to still another aspect of the present invention, there is provided a method of manufacturing a non-volatile semiconductor memory device having a plurality of memory strings in which a plurality of memory cells that are electrically rewritable and a plurality of selection transistors are connected in series, the method including: forming a first columnar semiconductor layer extending in a direction perpendicular to a substrate; forming a plurality of first conductive layers such that a charge storage layer for storing charges is sandwiched between the first conductive layers and the first columnar semiconductor layer; depositing a first interlayer insulating layer, a second conductive layer, and a second interlayer insulating layer one by one on the first columnar semiconductor layer; forming a selection transistor separation trench at a position above the first conductive layers by cutting through the second interlayer insulating layer and the second conductive layer and providing a certain interval in a first direction perpendicular to a laminating direction; filling up the selection transistor separation trench with an insulating film; forming, on the first columnar semiconductor layer, a second columnar semiconductor layer being in contact with the first columnar semiconductor layer such that an insulating layer is sandwiched between the second columnar semiconductor layer and the second conductive layer; removing the insulating film in the selection transistor separation trench selectively; and forming a first sidewall conductive layer on a side of the opened selection transistor separation trench along a longitudinal direction of the second conductive layer.

DETAILED DESCRIPTION OF THE EMBODIMENTS

Embodiments of the non-volatile semiconductor memory device according to the present invention will be described below with reference to drawings.

(First Embodiment)

(Structure of the Non-volatile Semiconductor Memory Device 100 According to the First Embodiment)

Figure 1:
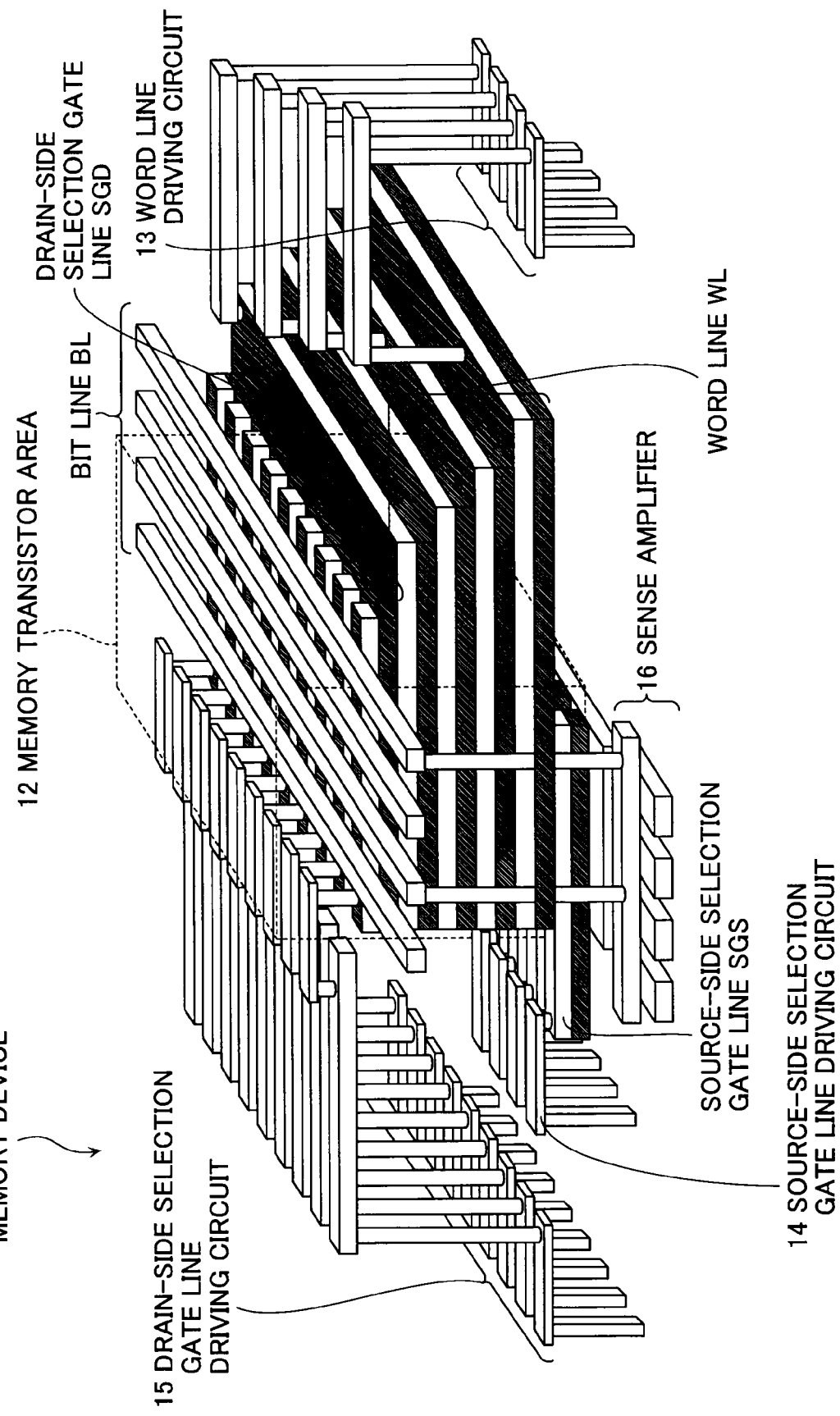
FIG. 1 is a schematic diagram of the structure of non-volatile semiconductor memory device 100 according to a first embodiment of the present invention.

FIG. 1 shows a schematic diagram of the non-volatile semiconductor memory device 100 according to the first embodiment of the present invention. As shown in FIG. 1, the non-volatile semiconductor memory device 100 according to the first embodiment mainly includes a memory transistor area 12, a word line driving circuit 13, a source-side selection gate line (SGS) driving circuit 14, a drain-side selection gate line (SGD) driving circuit 15, and a sense amplifier 16. The memory transistor area 12 has memory transistors for storing data. The word line driving circuit 13 controls the voltage applied to a word line WL. The source-side selection gate line (SGS) driving circuit 14 controls the voltage applied to a source-side selection gate line SGS. The drain-side selection gate line (SGD) driving circuit 15 controls the voltage applied to a drain-side selection gate line (SGD). The sense amplifier 16 amplifies the potential read from the memory transistors. In addition, the non-volatile semiconductor memory device 100 according to the first embodiment includes a bit line driving circuit for controlling the voltage applied to a bit line BL and a source line driving circuit for controlling the voltage applied to a source line SL (not shown).

Also, as shown in FIG. 1, the memory transistors constituting the memory transistor area 12 in the non-volatile semiconductor memory device 100 according to the first embodiment are formed by laminating a plurality of conductive layers.

Figure 2:
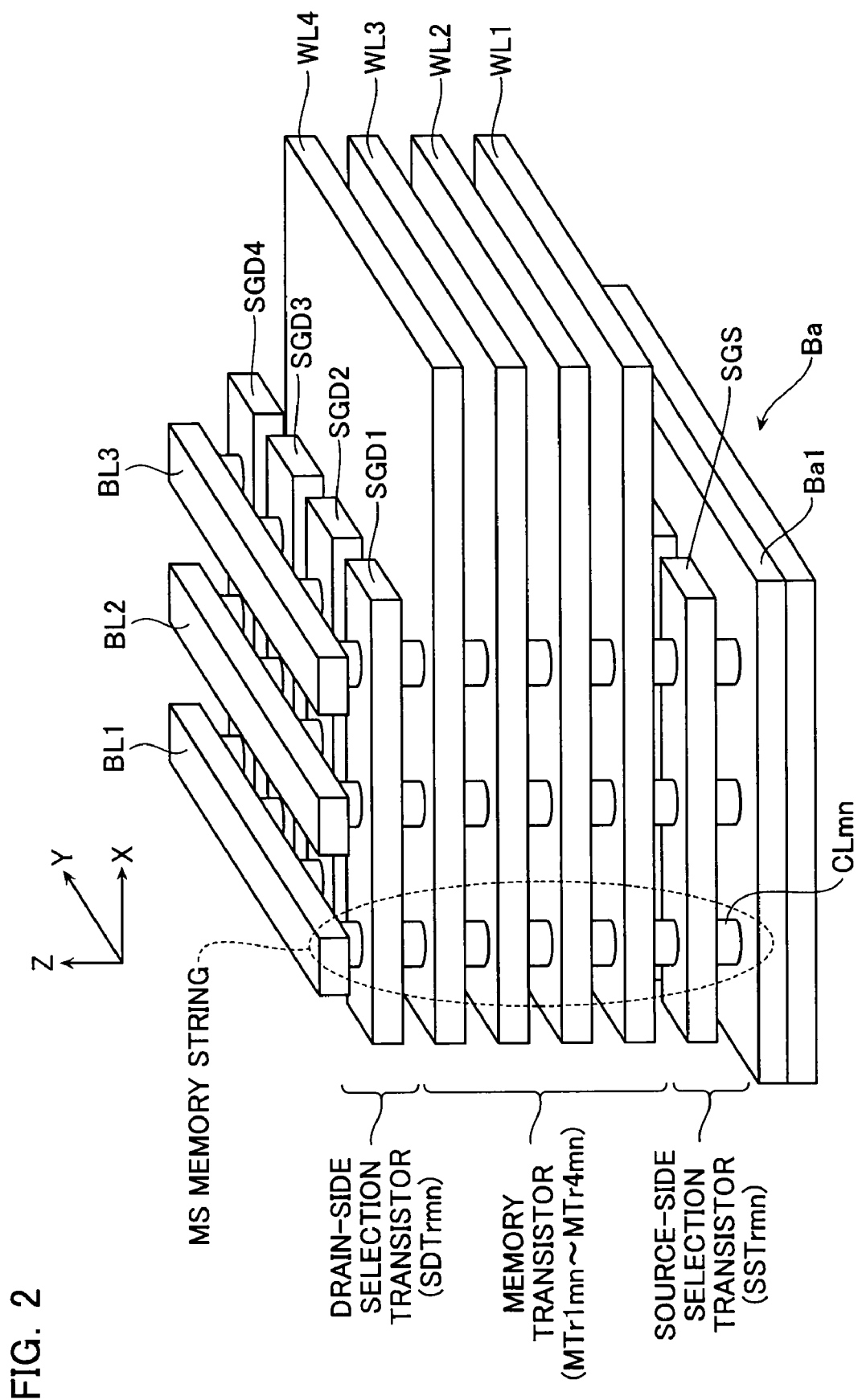
FIG. 2 is a schematic perspective view of a portion of a memory transistor area 12 of the non-volatile semiconductor memory device 100 according to the first embodiment of the present invention.

FIG. 2 is a schematic diagram of the structure of a portion of the memory transistor area 12 of the non-volatile semiconductor memory device 100 according to the first embodiment. In FIG. 2, the direction in which the above source-side selection gate line SGS and the drain-side selection gate line SGD extend is the X direction and the direction in which the above bit line BL extends is the Y direction. The direction in which each layer is laminated (laminating direction) is the Z direction. In the first embodiment, memory transistor area 12 has m×n (m and n are natural integers) memory strings MS consisting of memory transistors (nMOS) MTr1$mn$ to MTr4$nm$, a source-side selection transistor SSTrmn, and a drain-side selection transistor SDTrmn. FIG. 2 shows an example when m=3 and n=4.

In each of the memory string MS, each of word lines (WL1 to WL4) connected to the gate of the memory transistors (MTr1$mn$ to MTr4$nm$) is formed by the same conductive layer and used in common therein. That is, all gates of the memory transistor MTr1$mn$ of each memory string MS are connected to the word lines WL1. All gates of the memory transistor MTr2$nm$ of each memory string MS are connected to the word lines WL2. All gates of the memory transistor MTr3$nm$ of each memory string MS are connected to the word lines WL3. All gates of the memory transistor MTr4$nm$ of each memory string MS are connected to the word lines WL4. In the non-volatile semiconductor memory device 100 according to the first embodiment, as shown in FIGS. 1 and 2, each of the word lines (WL1 to WL4) in each layer expands in a two-dimensional manner in some area. The word lines (WL1 to WL4) in each layer have a plate-like planar structure constituted by the same layer. Moreover, the word lines (WL1 to WL4) are each arranged substantially perpendicularly to the memory string MS. Incidentally, the number of laminated word lines WL in FIGS. 1 and 2 is four, but the present embodiment is not limited to this and any number of layers may be used.

Each of the memory strings MS has columnar semiconductor CLmn (m=1 to 3 and n=1 to 4 in FIG. 2) in a columnar shape on an n+ type area formed in a P-well area Ba1 of a semiconductor substrate Ba. Each of the columnar semiconductors CLmn is formed in a direction (Z direction) perpendicular to the surface of the semiconductor substrate Ba and arranged in a matrix form on the surfaces of the semiconductor substrate Ba and the word lines (WL1 to WL4). That is, the memory strings MS are also arranged in a matrix form in a surface perpendicular to the columnar semiconductor CLmn. The columnar semiconductor CLmn may be in a cylindrical shape or a prismatic shape.

As shown in FIG. 2, the source-side selection gate lines SGS constituting the source-side selection transistor SSTrmn are provided. The source-side selection gate lines SGS contact the columnar semiconductor CLmn via an insulating layer (not shown) on the lower portion of the memory string MS. The source-side selection gate lines SGS are insulation-separated each other and, unlike the word lines WL1 to WL4, repeatedly provided in a line form at certain intervals in the Y direction (perpendicular to the laminating direction) in parallel with the semiconductor substrate Ba. The columnar semiconductor layers CLmn formed by penetrating the center of the source-side selection gate line SGS are provided in the center in the width direction thereof. Instead of forming the source-side selection gate line SGS insulation-separated from one another in a line form repeatedly, the source-side selection gate line SGS may be formed as a flat electrode common to all memory strings MS in one block.

Also, as shown in FIG. 2, the drain-side selection gate lines SGD (SGD1 to SGD4 in FIG. 2) constituting the drain-side selection transistor SDTrmn are provided. The drain-side selection gate lines SGD contact the columnar semiconductor CLmn via an insulating layer (not shown) on the upper portion of the memory string MS. The drain-side selection gate lines SGD are insulation-separated from one another and, unlike the word lines WL1 to WL4, repeatedly provided in a line form at certain intervals in the Y direction. The columnar semiconductor layers CLmn formed by penetrating the center of the drain-side selection gate line SGD are provided in the center in the width direction thereof.

Figure 3:
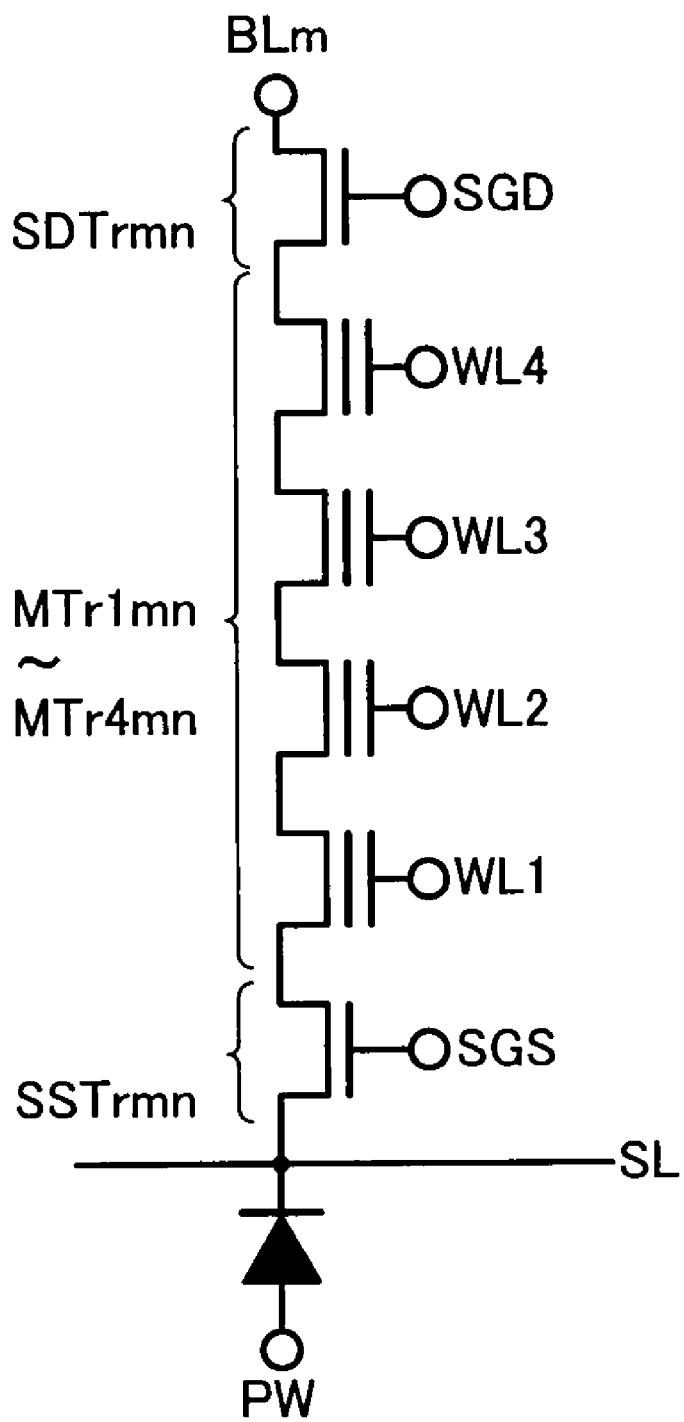
FIG. 3 is a circuit diagram of one memory string MS in the first embodiment of the present invention.

Next, the circuit configuration constituted by memory strings MS according to the first embodiment and operations thereof will be described with reference to FIGS. 2 and 3. FIG. 3 is a circuit diagram of one memory string MS in the first embodiment.

As shown in FIGS. 2 and 3, the memory string MS in the first embodiment includes four memory transistors MTr1*mn* to MTr4*nm*, a source-side selection transistor SSTrmn, and a drain-side selection transistor SDTrmn. These four memory transistors MTr1*mn* to MTr4*nm*, the source-side selection transistor SSTrmn, and the drain-side selection transistor SDTrmn are connected in series, respectively (See FIG. 3). In the memory string MS in the first embodiment, the columnar semiconductor CLmn is formed on the n+ type area formed in the p− type area (P-well area) Ba1 on the semiconductor substrate Ba.

The source line SL (n+ type area formed in the P-well area Ba1 of the semiconductor substrate Ba) is connected to the source of the source-side selection transistor SSTrmn. Bit lines BLm are connected to the drain of the drain-side selection transistors SDTrmn.

Each memory transistor MTrmn includes a columnar semiconductor CLmn. The memory transistor MTrmn also includes a tunnel insulating layer, a charge storage layer and a block insulating layer formed so as to surround the columnar semiconductor CLmn, and a word line WL formed so as to surround the tunnel insulating layer, the charge storage layer and the block insulating layer. The word line WL functions as a control gate electrode of the memory transistor MTrmn.

The source-side selection transistor SSTrmn includes a columnar semiconductor CLmn, an insulating layer formed so as to surround the columnar semiconductor CLmn, and a source-side selection gate line SGS formed so as to surround the insulating layer. The source-side selection gate line SGS functions as a control gate of the source-side selection transistor SSTrmn.

The drain-side selection transistor SDTrmn includes a columnar semiconductor CLmn, an insulating layer formed so as to surround the columnar semiconductor CLmn, and a drain-side selection gate line SGD formed so as to surround the insulating layer. The drain-side selection gate line SGD functions as a control gate of the drain-side selection transistor SDTrmn.

In the non-volatile semiconductor memory device 100 having the above configuration, voltages of the bit lines BL1 to BL3, drain-side selection gate line SGD, word lines WL1 to WL4, source-side selection gate line SGS, and the source line SL are controlled by the bit line driving circuit (not shown), a drain-side selection gate line driving circuit 15, a word line driving circuit 13, a source-side selection gate line driving circuit 14, and the source line driving circuit (not shown). That is, reading, writing, and erasing of data are performed by controlling charges in the charge storage layer of certain memory transistors MTrmn. In other words, the drain-side selection gate line driving circuit 15, the word line driving circuit 13, the source-side selection gate line driving circuit 14, the source line driving circuit, and the bit line driving circuit have a function as a control circuit to control the memory string MS.

(Concrete Configuration of the Memory String MS According to the First Embodiment)

Figure 4:
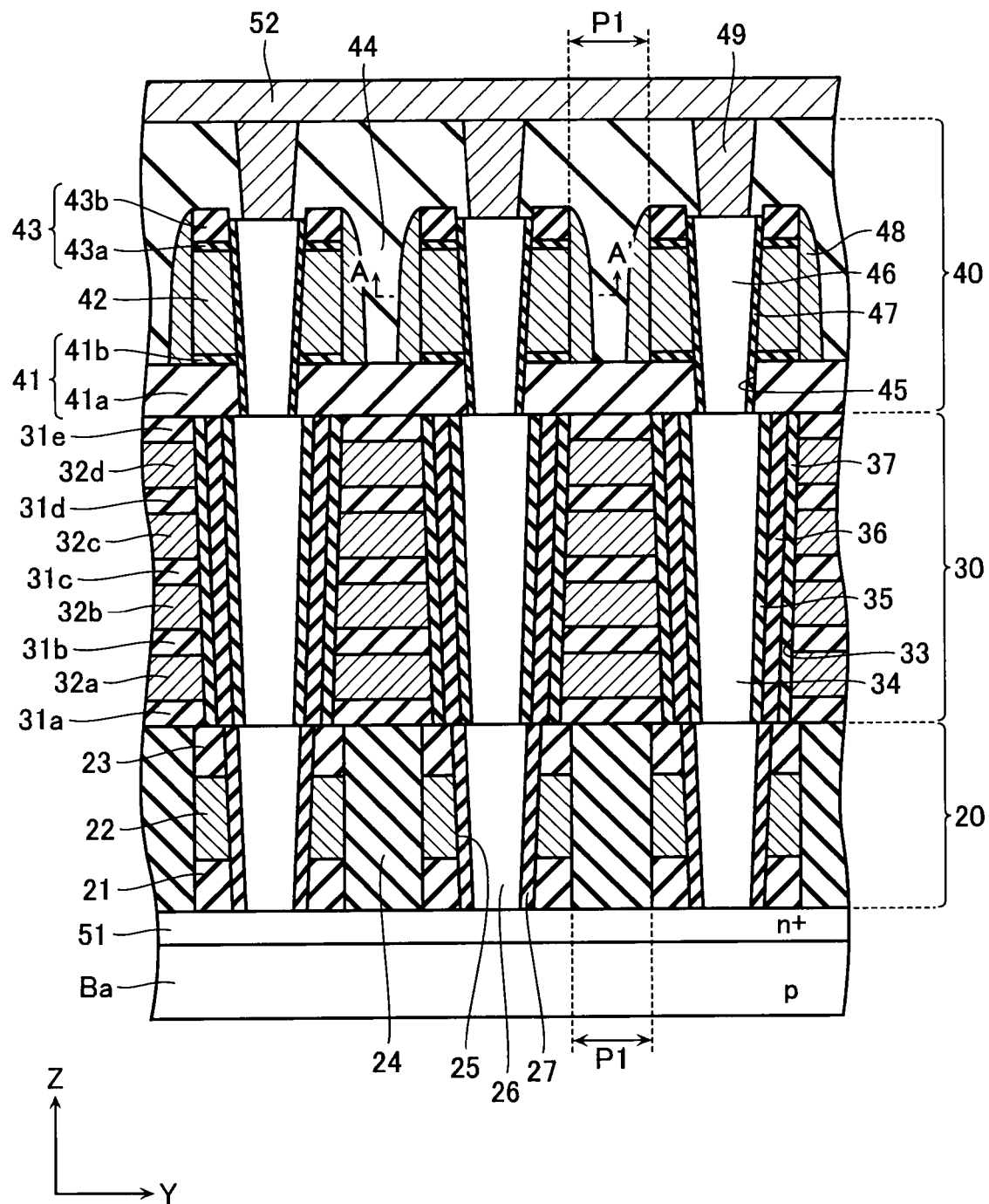
FIG. 4 is a sectional view of the memory string MS in the first embodiment.

Next, a concrete configuration of the memory string MS will be described with reference to FIG. 4. FIG. 4 is a sectional view of a portion of the memory string MS in the first embodiment. As shown in FIG. 4, the memory string MS includes a source-side selection transistor layer 20, a memory transistor layer 30, and a drain-side selection transistor layer 40 from lower layers to upper layers. The source-side selection transistor layer 20 functions as a source-side selection transistor SSTrmn. The memory transistor layer 30 functions as a memory transistor MTrmn. The drain-side selection transistor layer 40 functions as a drain-side selection transistor SDTrmn.

The source-side selection transistor layer 20 includes a source-side first insulating layer 21 formed on a source line layer 51 (functions as a source line SL) of the semiconductor substrate Ba, a source-side conductive layer 22 formed on the top surface of the source-side first insulating layer 21, and a source-side second insulating layer 23 formed on the top surface of the source-side conductive layer 22. The source-side first insulating layer 21, the source-side conductive layer 22, and the source-side second insulating layer 23 are repeatedly provided in a line form by providing a certain interval P1 in the Y direction. An interlayer insulating layer 24 is provided among the adjacent source-side first insulating layer 21, source-side conductive layer 22, and source-side second insulating layer 23. The source-side first insulating layer 21 and the source-side second insulating layer 23 are formed, for example, from a silicon oxide (SiO$_2$) film. The source-side conductive layer 22 is formed, for example, from polysilicon (p-Si). Incidentally, the source-side conductive layer 22 functions as a control gate of the above source-side selection transistor SSTrmn.

The source-side selection transistor layer 20 also includes a source-side hole 25 cut through the source-side first insulating layer 21, the source-side conductive layer 22, and the source-side second insulating layer 23 and a source-side columnar semiconductor layer 26 extending in a direction perpendicular to the semiconductor substrate Ba formed inside the source-side hole 25. The source-side columnar semiconductor layer 26 is formed, for example, from polysilicon (p-Si).

Further, the source-side selection transistor layer 20 includes a source-side gate insulating layer 27 formed by being in contact with the source-side columnar semiconductor layer 26. The source-side gate insulating layer 27 is in contact with the source-side conductive layer 22. The source-side gate insulating layer 27 is formed, for example, from a silicon oxide (SiO$_2$) film.

In the source-side selection transistor layer 20, to put the configuration of the source-side conductive layer 22 in other words, the source-side conductive layer 22 is formed such that the source-side gate insulating layer 27 is sandwiched between the source-side conductive layer 22 and the source-side columnar semiconductor layer 26.

The memory transistor layer 30 includes first to fifth inter-word-line insulating layers 31a to 31e provided above the source-side second insulating layer 23 and first to fourth word line conductive layers (first conductive layers) 32a to 32d provided among the first to fifth inter-word-line insulating layers 31a to 31e. The first to fifth inter-word-line insulating layers 31a to 31e are formed, for example, from a silicon oxide (SiO$_2$) film. The first to fourth word line conductive layers 32a to 32d are formed, for example, from polysilicon (p-Si). The first to fourth word line conductive layers 32a to 32d function as the above word lines WL1 to WL4.

The memory transistor layer 30 also includes a memory hole 33 formed to penetrate the first to fifth inter-word-line insulating layers 31a to 31e and the first to fourth word line conductive layers 32a to 32d and a memory columnar semiconductor layer 34 (first columnar semiconductor layer) extending in a direction perpendicular to the semiconductor substrate Ba formed inside the memory hole 33. The memory columnar semiconductor layer 34 is formed, for example, from polysilicon (p-Si).

Further, the memory transistor layer 30 includes a tunnel insulating layer 35 formed by being in contact with the memory columnar semiconductor layer 34, a charge storage layer 36 in contact with the tunnel insulating layer 35 to store charges, and a block insulating layer 37 in contact with the charge storage layer 36. The block insulating layer 37 is in contact with the first to fourth word line conductive layers 32a to 32d. The tunnel insulating layer 35 is formed, for example, from a silicon oxide (SiO$_2$) film. The charge storage layer 36 is formed, for example, from a silicon nitride (SiN) film. The block insulating layer 37 is formed, for example, from a silicon oxide (SiO$_2$) film.

In the memory transistor layer 30, to put the configuration of the first to fourth word line conductive layers 32a to 32d in other words, the first to fourth word line conductive layers 32a to 32d are formed such that the tunnel insulating layer 35, the charge storage layer 36, and the block insulating layer 37 are sandwiched between the first to fourth word line conductive layers 32a to 32d and the memory columnar semiconductor layer 34.

The drain-side selection transistor layer 40 includes a drain-side first insulating layer 41 including insulating layers 41a and 41b formed on the fifth inter-word-line insulating layer 31e, a drain-side first conductive layer (second conductive layer) 42 formed on the top surface of the drain-side first insulating layer 41, and a drain-side second insulating layer 43 including insulating layers 43a and 43b formed on the top surface of the drain-side first conductive layer 42. The insulating layer 41b, the drain-side first conductive layer 42, and the drain-side second insulating layer 43 are repeatedly provided in a line form by providing the certain interval P1 in the Y direction. A drain-side second conductive layer (first sidewall conductive layer) 48 is formed on sidewalls of the insulating layer 41b, the drain-side first conductive layer 42, and the drain-side second insulating layer 43 that are adjacent to each other with the space of the interval P1. The drain-side second conductive layer 48 is in contact with the insulating layer 41b, the drain-side first conductive layer 42, and the drain-side second insulating layer 43 and are formed, like the insulating layer 41b, the drain-side first conductive layer 42, and the drain-side second insulating layer 43, by extending in the X direction shown in FIG. 2. An interlayer insulating layer 44 is provided between the insulating layers 41b, the drain-side first conductive layers 42, the drain-side second insulating layers 43, and the drain-side second conductive layers 48 in the Y direction.

The insulating layer 41a and the insulating layer 43b are formed, for example, from a silicon nitride (SiN) film. The insulating layer 41b, the insulating layer 43a, and the interlayer insulating layer 44 are formed, for example, from a silicon oxide (SiO$_2$) film. The drain-side first conductive layer 42 and the drain-side second conductive layer 48 are formed, for example, from polysilicon (p-Si). The drain-side first conductive layer 42 and the drain-side second conductive layer 48 function as control gate of the above drain-side selection transistor SDTrmn.

The drain-side selection transistor layer 40 includes a drain-side hole 45 formed to penetrate the drain-side first insulating layer 41, the drain-side first conductive layer 42, and the drain-side second insulating layer 43 and a drain-side columnar semiconductor layer (second columnar semiconductor layer) 46 extending in a direction perpendicular to the semiconductor substrate Ba formed inside the drain-side hole 45. The drain-side columnar semiconductor layer 46 is formed, for example, from polysilicon (p-Si).

Further, the drain-side selection transistor layer 40 includes a drain-side gate insulating layer 47 formed by being in contact with the drain-side columnar semiconductor layer 46. The drain-side gate insulating layer 47 is in contact with the drain-side first conductive layer 42. The drain-side gate insulating layer 47 is formed, for example, from a silicon oxide (SiO$_2$) film.

In the drain-side selection transistor layer 40, to put the configuration of the drain-side first conductive layer 42 in other words, the drain-side first conductive layer 42 is formed such that the drain-side gate insulating layer 47 is sandwiched between the drain-side first conductive layer 42 and the drain-side columnar semiconductor layer 46.

The drain-side selection transistor layer 40 has a drain-side contact plug layer 49 provided in such a manner that the drain-side contact plug layer 49 penetrate the interlayer insulating layer 44 and reach the drain-side columnar semiconductor layer 46. The drain-side contact plug layer 49 is formed, for example, from tungsten (W), aluminum (Al), or copper (Cu).

A bit line layer 52 is formed on the upper side of the drain-side selection transistor layer 40. The bit line layer 52 functions as a bit line BL. The bit line layer 52 is connected to the drain-side columnar semiconductor layer 46 via the drain-side contact plug layer 49.

(Manufacturing Process of the Non-volatile Semiconductor Memory Device 100 According to the First Embodiment)

Next, the manufacturing process of the drain-side selection transistor layer 40 of a non-volatile semiconductor memory device according to the present embodiment will be described with reference to FIG. 5 to FIG. 13. FIG. 5 to FIG. 13 are sectional views showing the drain-side selection transistor layer 40 in the manufacturing process of a non-volatile semiconductor memory device according to the present embodiment.

Figure 5:
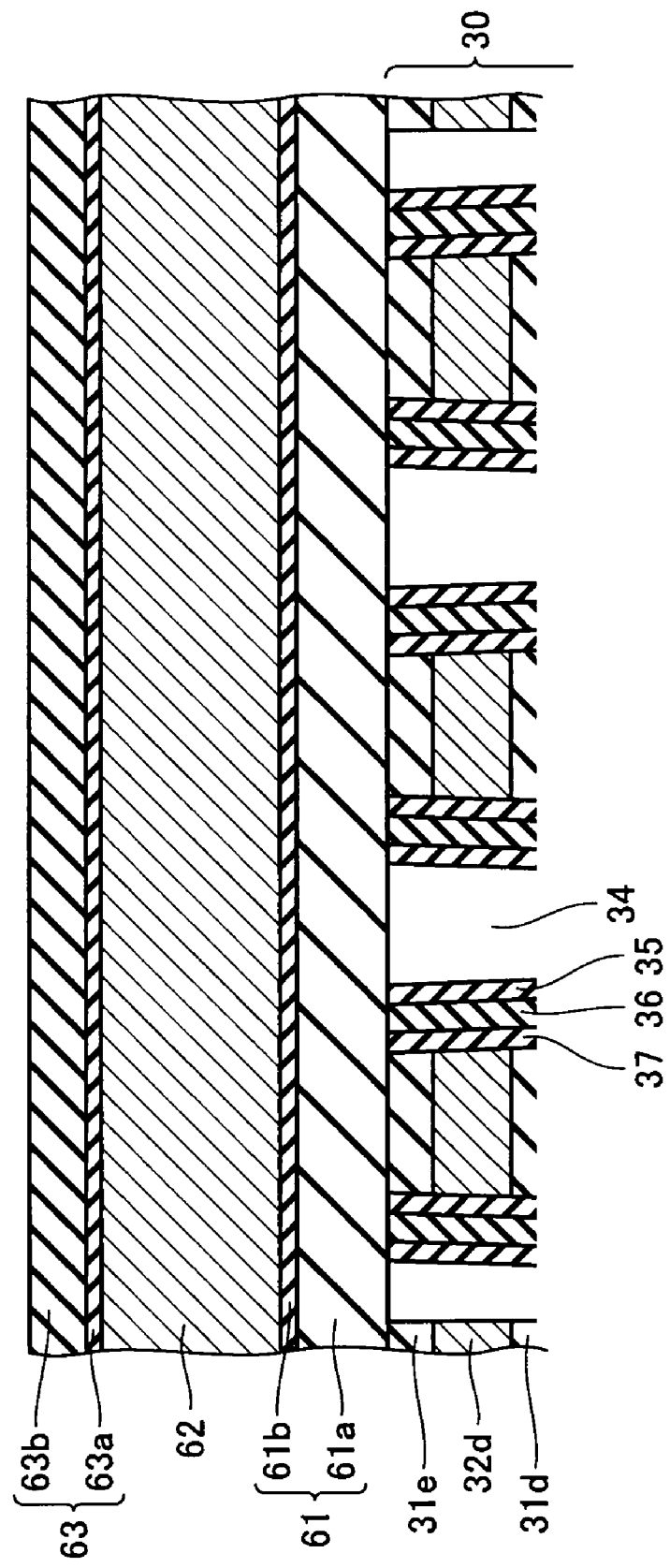
FIG. 5 is a sectional view showing a manufacturing process of the non-volatile semiconductor memory device 100 according to the first embodiment.

As shown in FIG. 5, a silicon nitride (SiN) film 61a, a silicon oxide ($SiO_2$) film 61b, a polysilicon (p-Si) film 62, a silicon oxide ($SiO_2$) film 63a, and a silicon nitride (SiN) film 63b are deposited one after another on the memory transistor layer 30. The silicon nitride film 61a, the silicon oxide film 61b, the polysilicon film 62, the silicon oxide film 63a, and the silicon nitride film 63b will become the drain-side first insulating layer 41, the drain-side first conductive layer 42, and the drain-side second insulating layer 43 after processes shown later.

Figure 6:
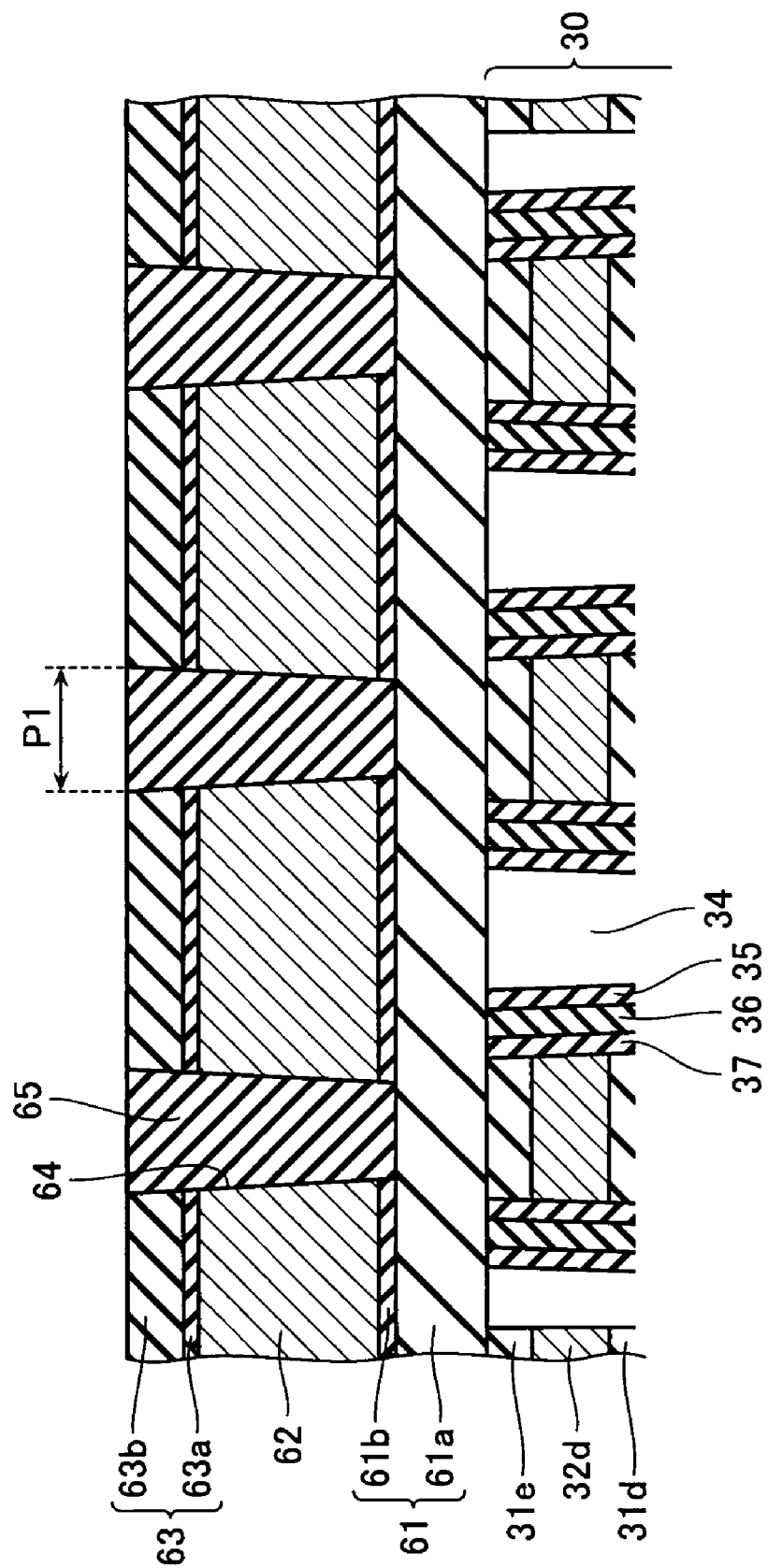
FIG. 6 is a sectional view showing a manufacturing process of the non-volatile semiconductor memory device 100 according to the first embodiment.

Next, as shown in FIG. 6, a selection transistor separation trench 64 is formed in a position above the laminated structure of the first to fifth inter-word-line insulating layers 31a to 31e and the first to fourth word line conductive layers (first conductive layers) 32a to 32d. The selection transistor separation trench 64 is repeatedly formed by providing the certain interval P1. The selection transistor separation trench 64 is formed so as to reach the silicon nitride film 61a by penetrating the silicon nitride film 63b, the silicon oxide film 63a, the polysilicon film 62, and the silicon oxide film 61b. The polysilicon (p-Si) film 62 is made a drain-side selection gate line SGD in a line form by the selection transistor separation trench 64. After a silicon oxide ($SiO_2$) film 65 being deposited on the entire surface of the silicon nitride film 63b including the inside of the selection transistor separation trench 64, the surface thereof is planarized by the CMP (Chemical Mechanical Polishing) method. The selection transistor separation trench 64 is thereby filled up with the silicon oxide film 65.

Figure 7:
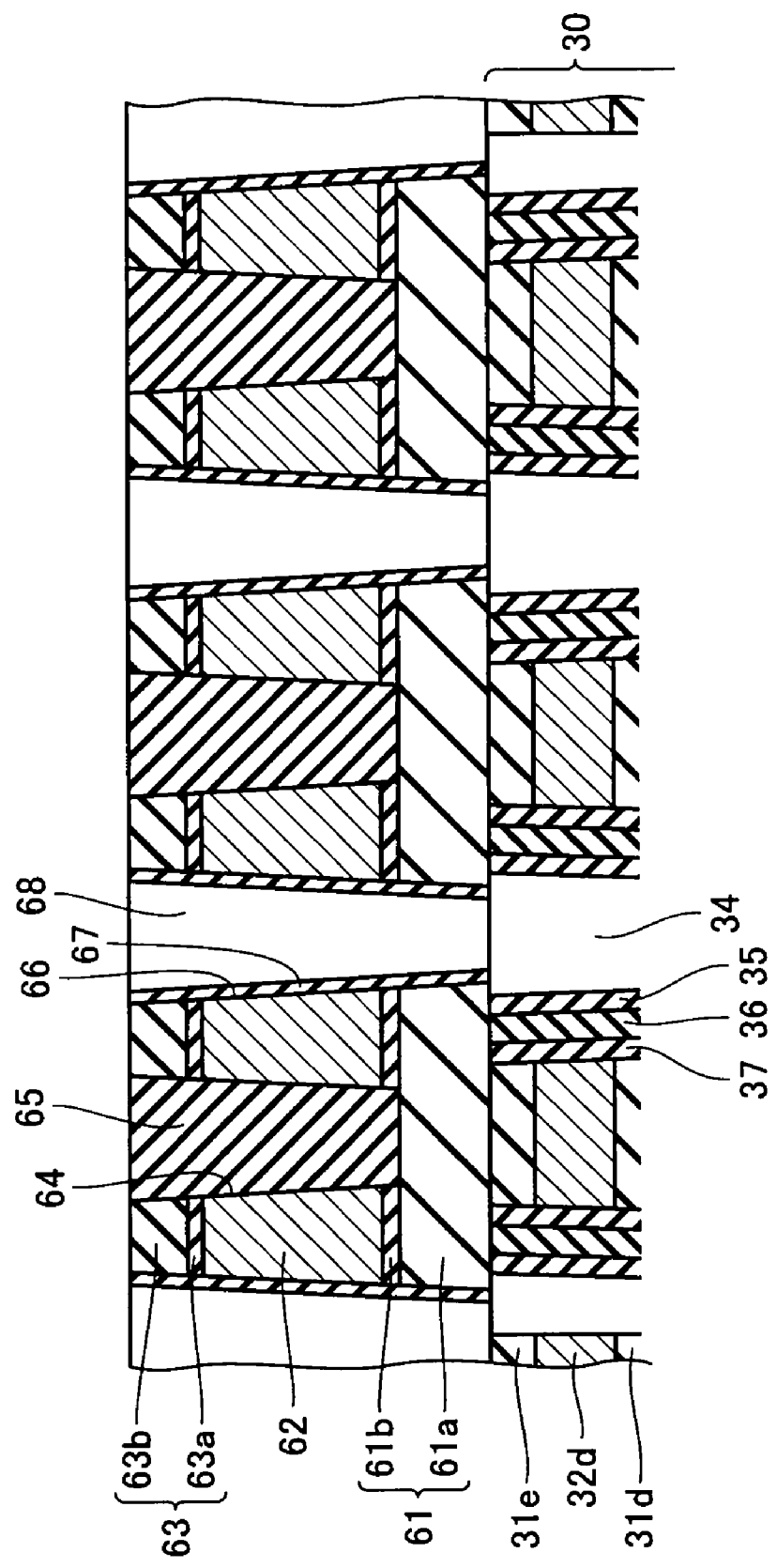
FIG. 7 is a sectional view showing a manufacturing process of the non-volatile semiconductor memory device 100 according to the first embodiment.

Next, as shown in FIG. 7, a drain-side hole 66 is formed in a position matching the memory columnar semiconductor layer 34 so as to reach the memory columnar semiconductor layer 34 by penetrating the silicon nitride film 63b, the silicon oxide film 63a, the polysilicon film 62, the silicon oxide film 61b, and the silicon nitride film 61a. After a silicon oxide film being deposited inside the drain-side hole 66, the silicon oxide film at the bottom of the drain-side hole 66 is removed by etchback. A drain-side gate insulating layer 67 is formed by this process on the sidewall of the drain-side hole 66. Then, polysilicon (p-Si) is deposited on the entire surface including the inside of the drain-side hole 66. By etching the polysilicon using the RIE (Reactive Ion Etching) method, a drain-side columnar semiconductor layer 68 to be a channel of the drain-side selection transistor SDTrmn is formed.

Figure 8:
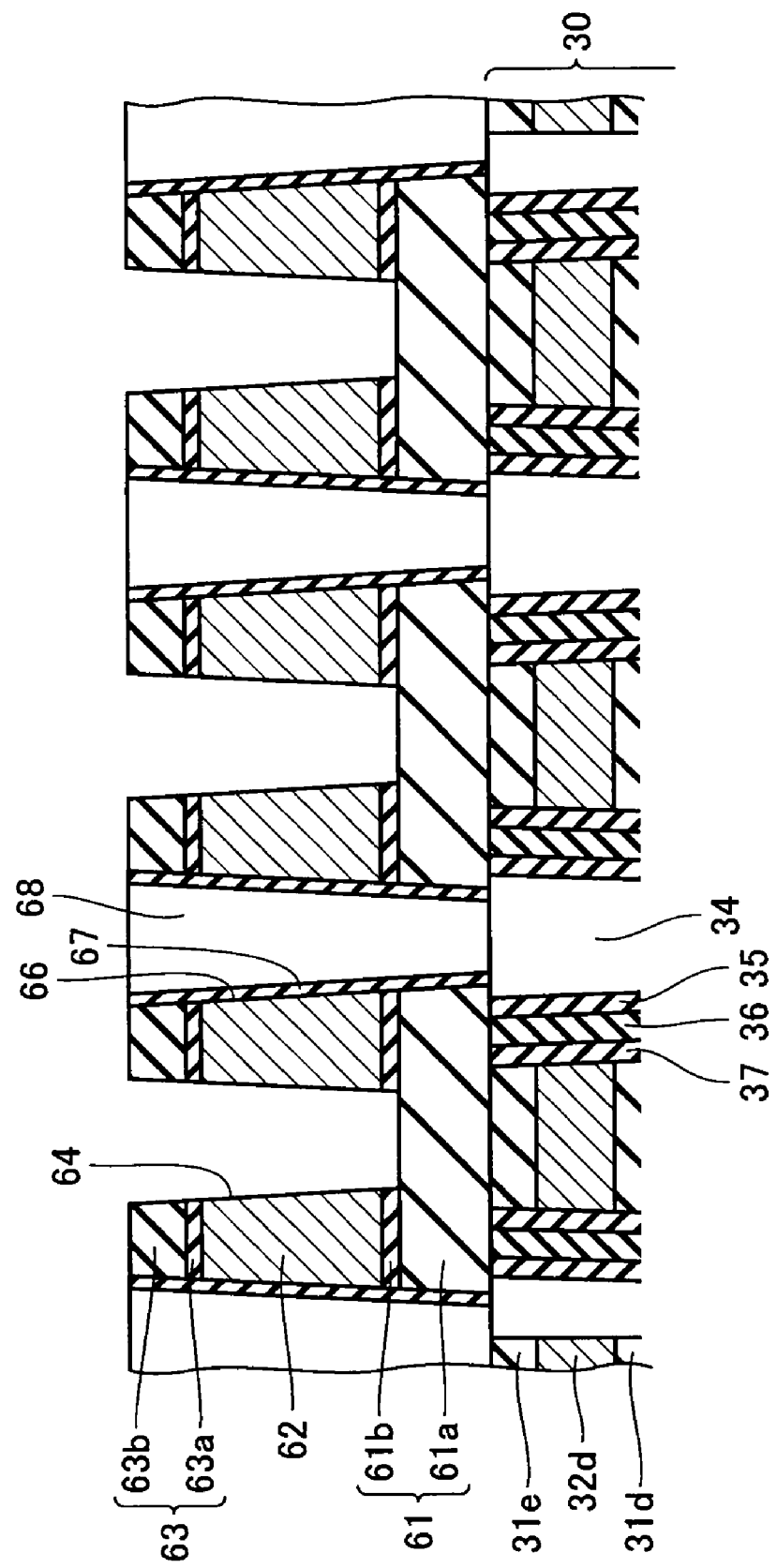
FIG. 8 is a sectional view showing a manufacturing process of the non-volatile semiconductor memory device 100 according to the first embodiment.

Next, as shown in FIG. 8, the silicon oxide film 65 inside the selection transistor separation trench 64 formed in a line form is selectively removed.

Figure 9:
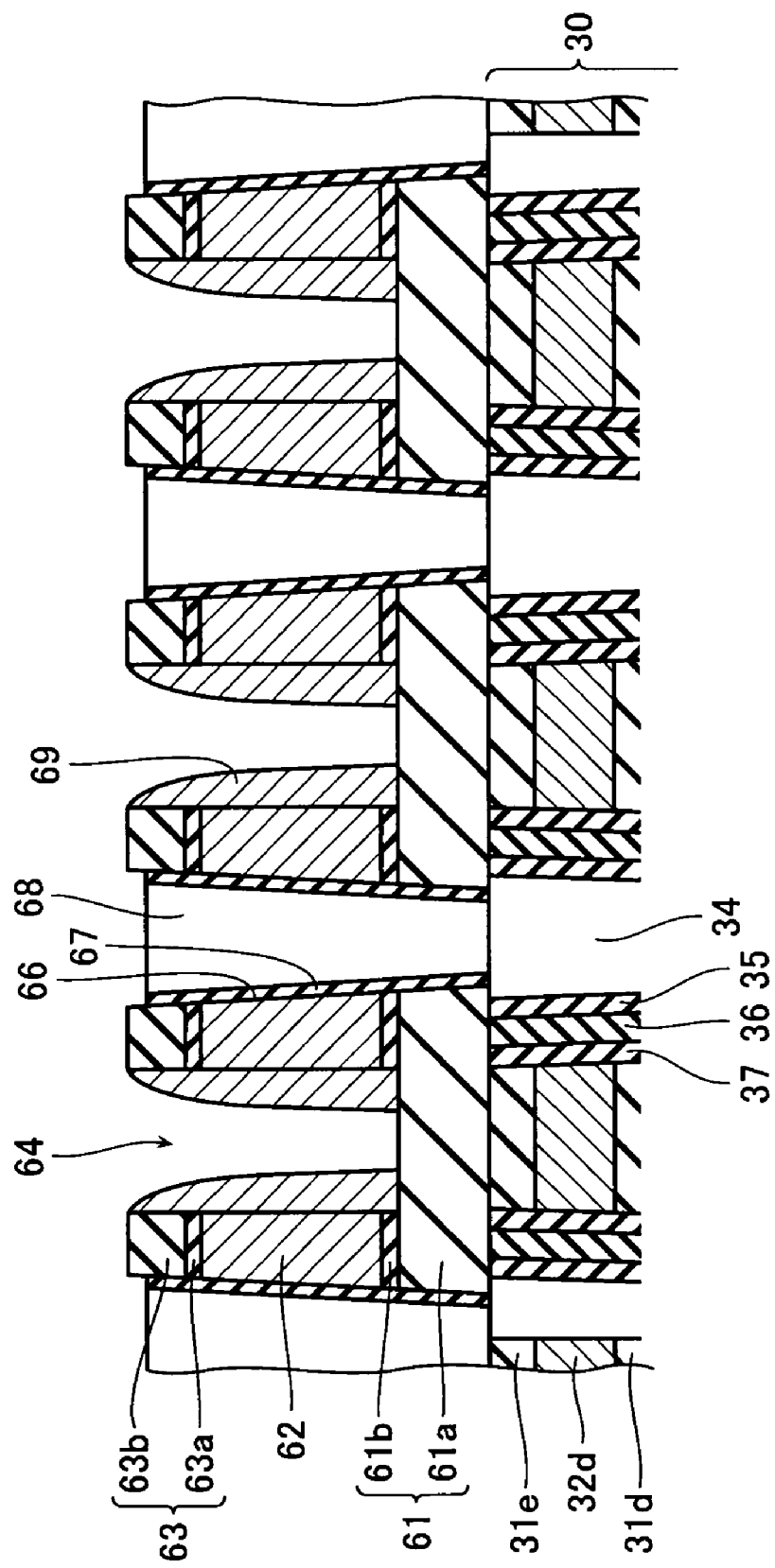
FIG. 9 is a sectional view showing a manufacturing process of the non-volatile semiconductor memory device 100 according to the first embodiment.

Next, as shown in FIG. 9, a polysilicon film is deposited on the entire surface of the drain-side selection transistor layer 40 including the inside of the opened selection transistor separation trench 64. Then, the polysilicon film is etched using, for example, the RIE (Reactive Ion Etching) method. The polysilicon film at the bottom of the selection transistor separation trench 64 and on the top surface of the drain-side columnar semiconductor layer 68 is removed by etching. However, a polysilicon film 69 formed on the side of the selection transistor separation trench 64 is not removed and remains. The polysilicon film 69 remaining on the sidewalls of the silicon oxide film 61b, the polysilicon film 62, the silicon oxide film 63a, and the silicon nitride film 63b will become the drain-side second conductive layer 48 after processes shown later. At this point, an upper portion of the drain-side columnar semiconductor layer 68 to be a channel of the drain-side selection transistor SDTrmn has been etched.

Figure 10:
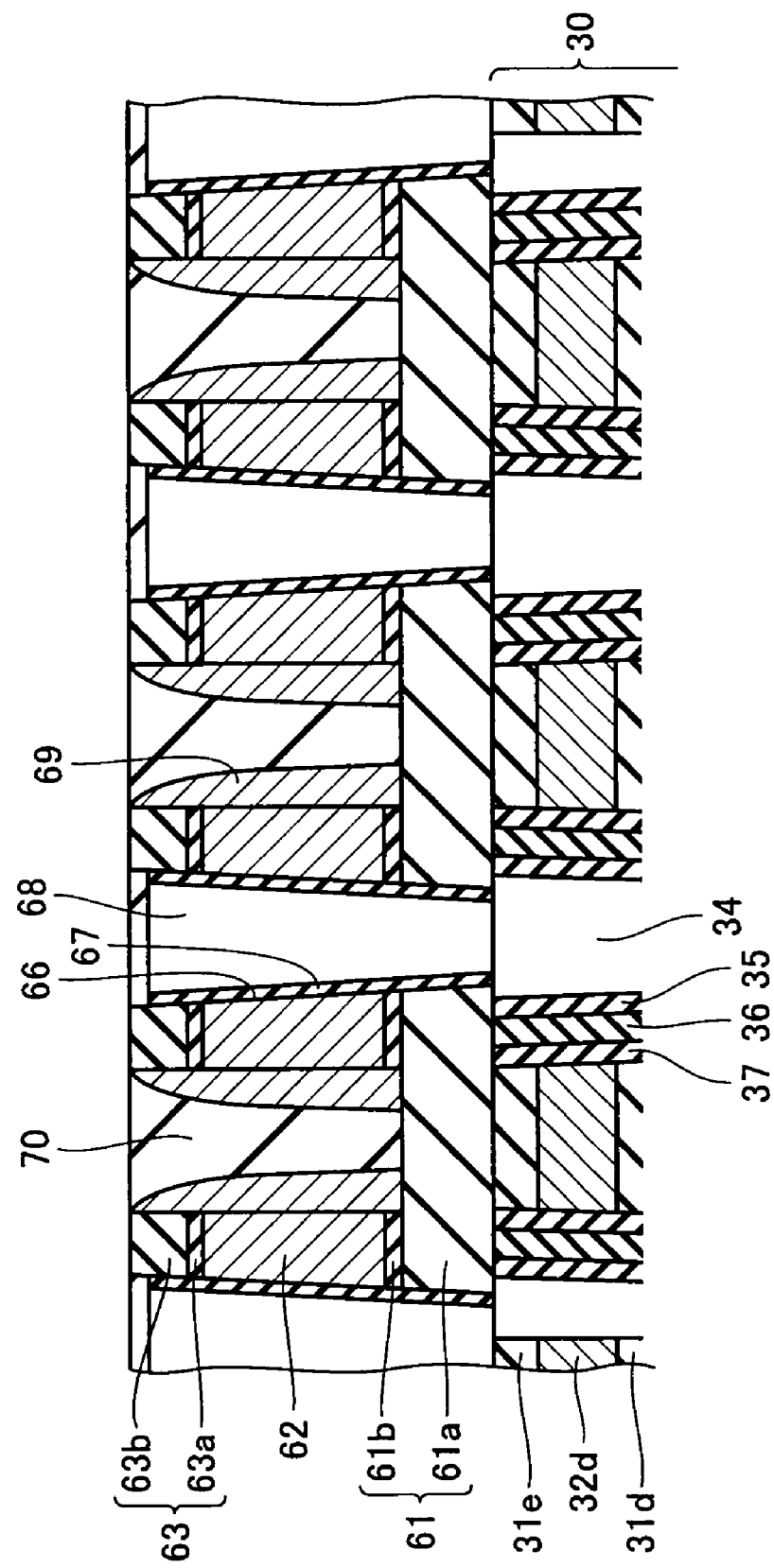
FIG. 10 is a sectional view showing a manufacturing process of the non-volatile semiconductor memory device 100 according to the first embodiment.

Next, as shown in FIG. 10, after a silicon oxide film 70 being deposited on the entire surface of the drain-side selection transistor layer 40 including the inside of the selection transistor separation trench 64, the surface thereof is planarized by the CMP (Chemical Mechanical Polishing) method. The selection transistor separation trench 64 is thereby filled up with the silicon oxide film 70.

Figure 11:
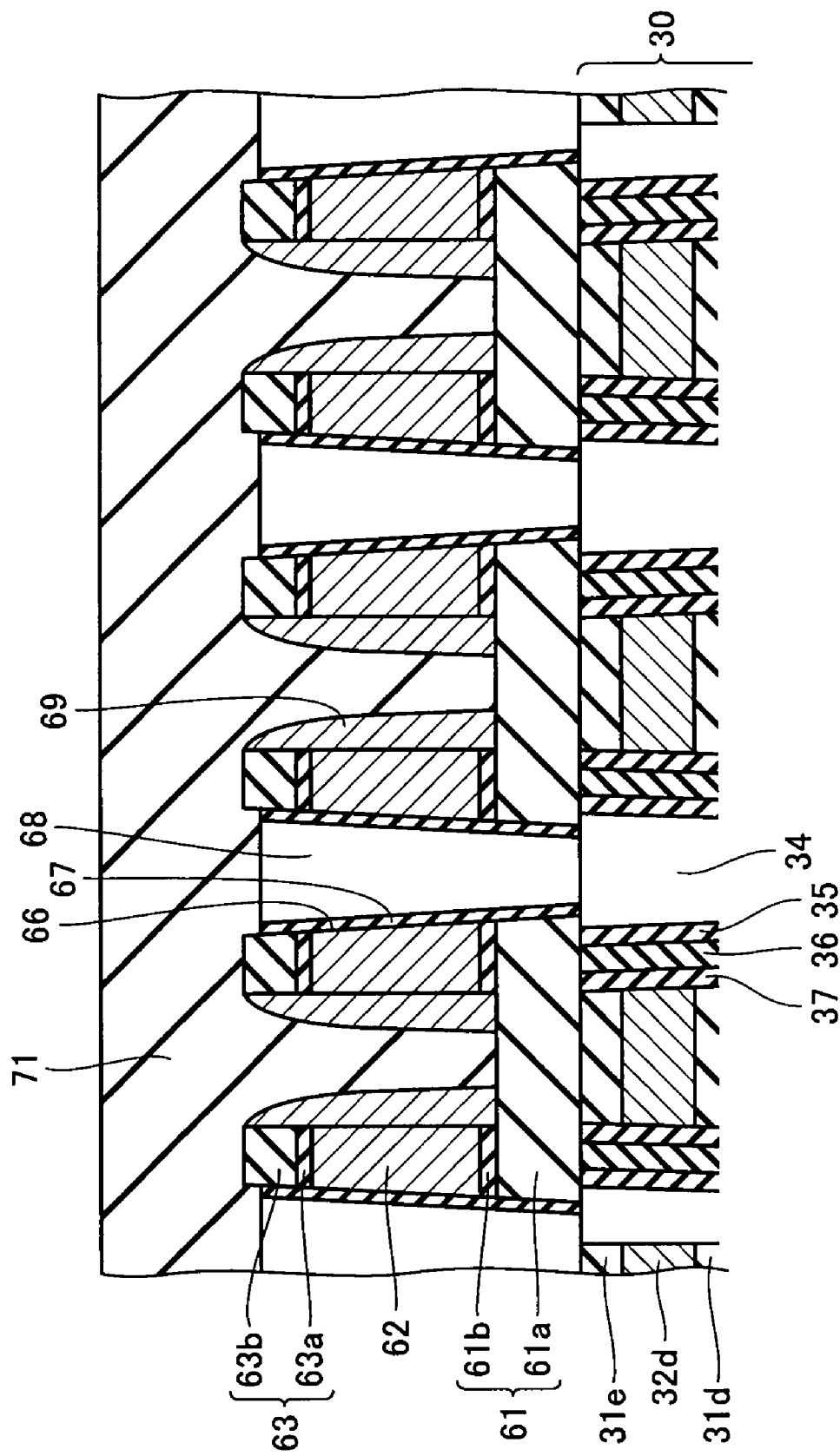
FIG. 11 is a sectional view showing a manufacturing process of the non-volatile semiconductor memory device 100 according to the first embodiment.

Next, as shown in FIG. 11, a silicon oxide film 71 is further deposited on the silicon oxide film 70. The silicon oxide film 71 will become the interlayer insulating layer 44 after processes shown later.

Figure 12:
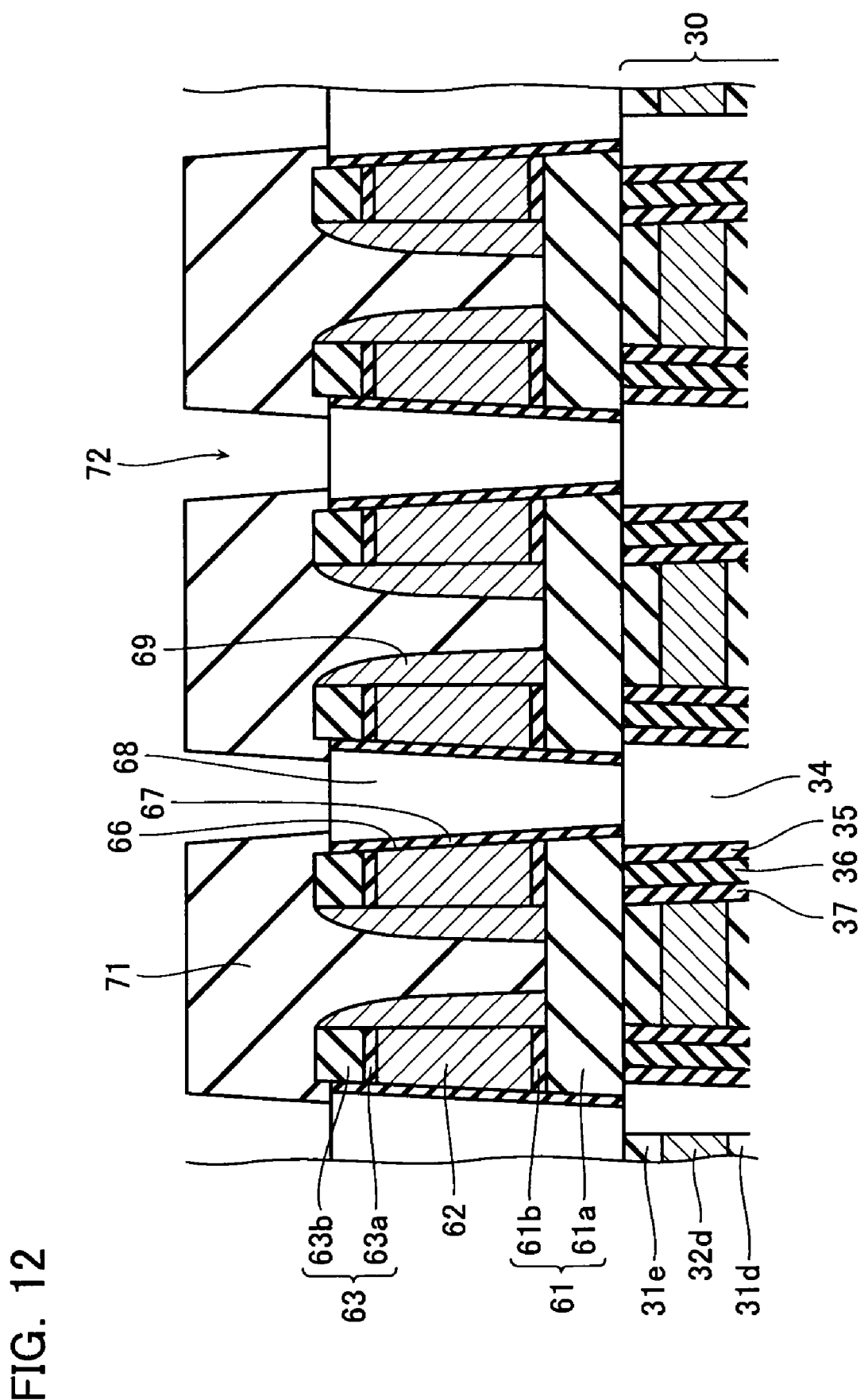
FIG. 12 is a sectional view showing a manufacturing process of the non-volatile semiconductor memory device 100 according to the first embodiment.

Next, as shown in FIG. 12, a hole 72 for a drain-side contact plug layer is formed so as to reach the drain-side columnar semiconductor layer 68 by penetrating the silicon oxide film 71.

Figure 13:
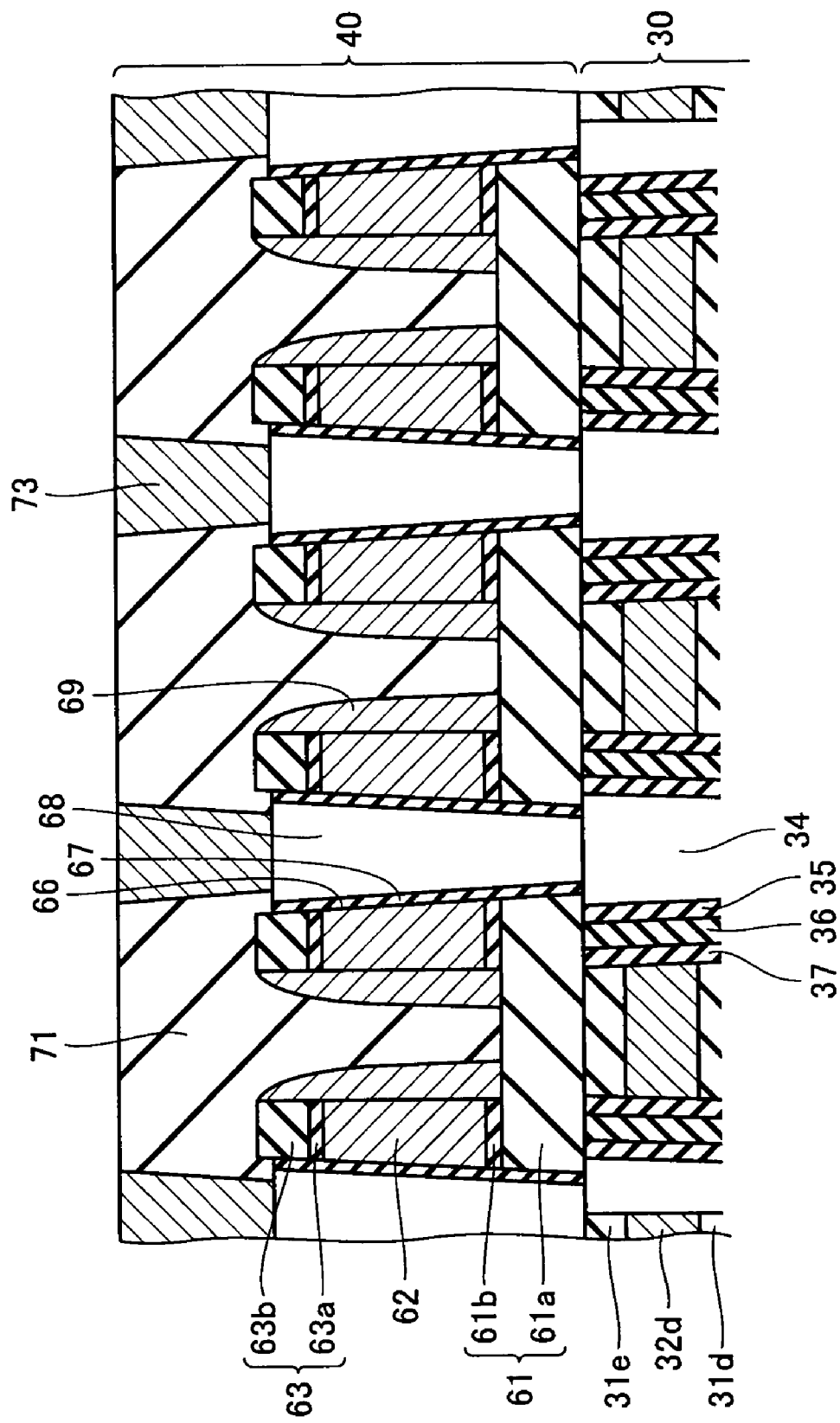
FIG. 13 is a sectional view showing a manufacturing process of the non-volatile semiconductor memory device 100 according to the first embodiment.

Next, as shown in FIG. 13, after, for example, tungsten (W) being deposited inside the hole 72, the surface is planarized to form a drain-side contact plug layer 73. Then, the bit line layer 52 to be a bit line is formed by being in contact with the drain-side contact plug layer 73. The bit line layer 52 is formed, for example, from tungsten (W). In this manner, the drain-side selection transistor layer 40 of a non-volatile semiconductor memory device according to the first embodiment can be formed.

(Effects of the Non-Volatile Semiconductor Memory Device 100 According to the First Embodiment)

Next, effects of the non-volatile semiconductor memory device 100 according to the first embodiment will be described. As shown in the above structure, the non-volatile semiconductor memory device 100 according to the first embodiment has vertical memory strings MS and thus, high integration can be achieved.

Figure 14A:
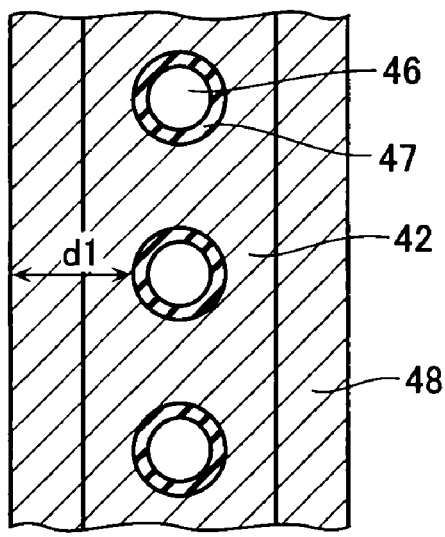
FIG. 14A is a top view illustrating the non-volatile semiconductor memory device 100 according to the first embodiment.
Figure 14B:
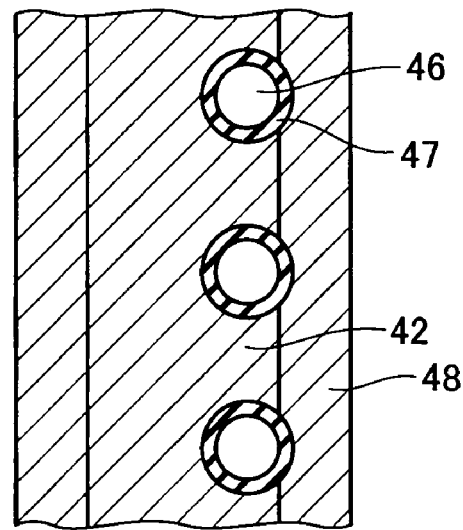
FIG. 14B is a top view illustrating the non-volatile semiconductor memory device 100 according to the first embodiment.
Figure 15A:
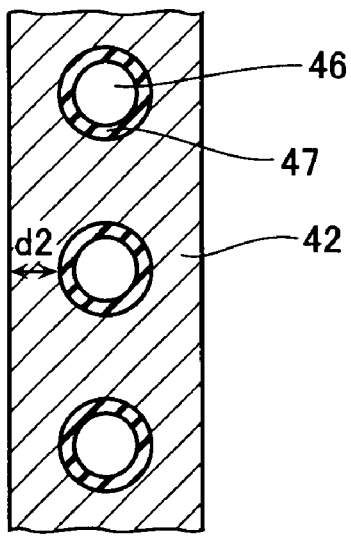
FIG. 15A is a top view illustrating a non-volatile semiconductor memory device of a comparative example.
Figure 15B:
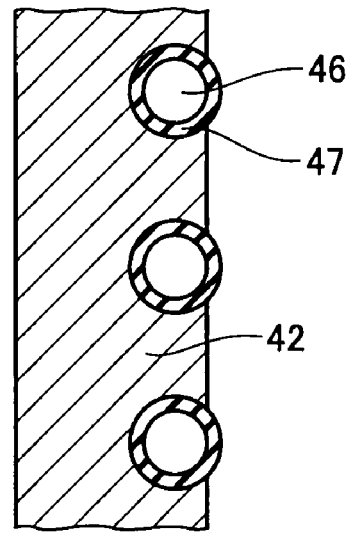
FIG. 15B is a top view illustrating the non-volatile semiconductor memory device of the comparative example.

FIGS. 14A and 14B are top views of A-A' lines shown in FIG. 4 of the non-volatile semiconductor memory device 100 according to the present embodiment. FIGS. 15A and 15B are top views of portions corresponding to the A-A' lines shown in FIG. 4 of a non-volatile semiconductor memory device of a comparative example.

As shown in FIG. 15A, the non-volatile semiconductor memory device of the comparative example does not have the drain-side second conductive layer 48 formed around the drain-side first conductive layer 42 formed in a line form. In this case, when the drain-side hole 45 is formed, the drain-side columnar semiconductor layer 46 may deviate from the drain-side first conductive layer 42 due to dispersion in diameter of contact of the drain-side columnar semiconductor layer 46 or misalignment when a hole is formed (See FIG. 15B). Accordingly, the drain-side selection transistor SDTrmn may be subjected to dispersion in characteristics. On the other hand, in the non-volatile semiconductor memory device 100 according to the first embodiment, as shown in FIG. 14A, the drain-side second conductive layer 48 is provided on the sidewall of the drain-side first conductive layer 42 formed in a line form. Thus, even if the drain-side columnar semiconductor layer 46 deviates from the drain-side first conductive layer 42 due, for example, to misalignment when a hole is formed, the drain-side columnar semiconductor layer 46 will be completely surrounded by the drain-side first conductive layer 42 and the drain-side second conductive layer 48 in a process of forming the drain-side second conductive layer 48 (See FIG. 14B). Thus, characteristics of the drain-side selection transistor SDTrmn can be made uniform.

In addition to the drain-side first conductive layer 42, the drain-side second conductive layer 48 also functions as a gate electrode of the drain-side selection transistor SDTrmn and a drain-side selection gate line SGD. The drain-side first conductive layer 42 and the drain-side second conductive layer 48 have a width d1 wider than a width d2 of the drain-side first conductive layer 42 only. Thus, resistance of the gate electrode of the drain-side selection transistor SDTrmn and that of the drain-side selection gate line SGD can be reduced.

Thus, as described above, the non-volatile semiconductor memory device 100 according to the first embodiment is provided with a selection transistor whose characteristics do not disperse and having a low-resistance gate line.

(Second Embodiment)
(Configuration of a Non-volatile Semiconductor Memory Device According to the Second Embodiment)

Next, a concrete configuration of a non-volatile semiconductor memory device according to the second embodiment of the present invention will be described with reference to FIG. 16. In the second embodiment, the same reference numerals are attached to components similar to those in the first embodiment and a description thereof is omitted here.

Figure 16:
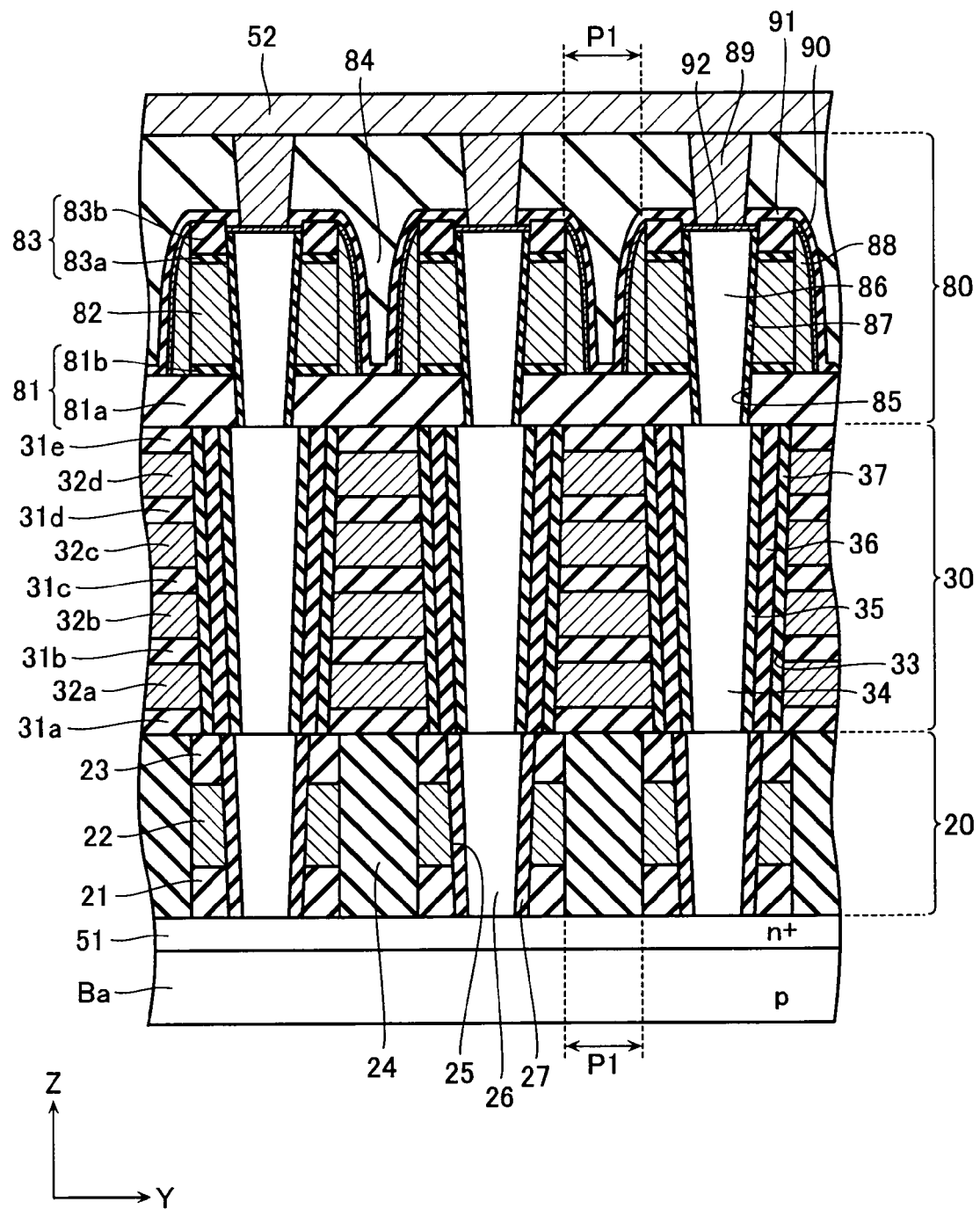
FIG. 16 is a sectional view of a memory string MS according to a second embodiment.

FIG. 16 is a sectional view of a memory string MS according to the second embodiment. As shown in FIG. 16, the memory string MS includes the source-side selection transistor layer 20, the memory transistor layer 30, and a drain-side selection transistor layer 80 from lower layers to upper layers. The source-side selection transistor layer 20 functions as a source-side selection transistor SSTrmn. The memory transistor layer 30 functions as a memory transistor MTrmn. The drain-side selection transistor layer 80 functions as a drain-side selection transistor SDTrmn.

The drain-side selection transistor layer 80 includes a drain-side first insulating layer 81 including insulating layers 81a and 81b formed on the fifth inter-word-line insulating layer 31e, a drain-side first conductive layer 82 formed on the top surface of the drain-side first insulating layer 81, and a drain-side second insulating layer 83 including insulating layers 83a and 83b formed on the top surface of the drain-side first conductive layer 82. The insulating layer 81b, the drain-side first conductive layer 82, and the drain-side second insulating layer 83 are repeatedly provided in a line form by providing the certain interval P1 in the Y direction. A drain-side second conductive layer 88 is formed on sidewalls of the insulating layer 81b, the drain-side first conductive layer 82, and the drain-side second insulating layer 83 that are adjacent to each other with the space of the interval P1. The drain-side second conductive layer 88 is in contact with the insulating layer 81b, the drain-side first conductive layer 82, and the drain-side second insulating layer 83 and are formed, like the insulating layer 81b, the drain-side first conductive layer 82, and the drain-side second insulating layer 83, by extending in the X direction shown in FIG. 2. In the present embodiment, a silicide layer 90 is formed on the surface of the drain-side second conductive layer 88. An insulating layer 91 is formed so as to cover the drain-side first conductive layer 82, the drain-side second conductive layer 88, and the silicide layer 90 provided in a line form. An interlayer insulating layer 84 is provided between the silicide layers 90 in the Y direction.

The insulating layer 81a, the insulating layer 83b, and the insulating layer 91 are formed, for example, from a silicon nitride (SiN) film. The insulating layer 81b, the insulating layer 83a, and the interlayer insulating layer 84 are formed, for example, from a silicon oxide (SiO$_2$) film. The drain-side first conductive layer 82 and the drain-side second conductive layer 88 are formed, for example, from polysilicon (p-Si). The silicide layer 90 is formed, for example, from titanium silicide (TiSi), cobalt silicide (CoSi), or nickel silicide (NiSi). The drain-side first conductive layer 82, the drain-side second conductive layer 88, and the silicide layer 90 function as control gate of the above drain-side selection transistor SDTrmn.

The drain-side selection transistor layer 80 also includes a drain-side hole 85 formed to penetrate the drain-side first insulating layer 81, the drain-side first conductive layer 82, and the drain-side second insulating layer 83 and a drain-side columnar semiconductor layer 86 extending in a direction perpendicular to the semiconductor substrate Ba formed inside the drain-side hole 85. The drain-side columnar semiconductor layer 86 is formed, for example, from polysilicon (p-Si). In the present embodiment, a silicide layer 92 is formed also on the top surface of the drain-side columnar semiconductor layer 86.

Further, the drain-side selection transistor layer 80 includes a drain-side gate insulating layer 87 formed by being in contact with the drain-side columnar semiconductor layer 86. The drain-side gate insulating layer 87 is in contact with the drain-side first conductive layer 82. The drain-side gate insulating layer 87 is formed, for example, from a silicon oxide (SiO$_2$) film.

In the drain-side selection transistor layer 80, to put the configuration of the drain-side first conductive layer 82 in other words, the drain-side first conductive layer 82 is formed such that the drain-side gate insulating layer 87 is sandwiched between the drain-side first conductive layer 82 and the drain-side columnar semiconductor layer 86.

The drain-side selection transistor layer 80 has a drain-side contact plug layer 89 provided in such a manner that the drain-side contact plug layer 89 penetrate the interlayer insulating layer 84 and reach the silicide layer 92 on the top surface of the drain-side columnar semiconductor layer 86. The drain-side contact plug layer 89 is formed, for example, from tungsten (W), aluminum (Al), or copper (Cu).

The bit line layer 52 is formed on the upper side of the drain-side selection transistor layer 80. The bit line layer 52 functions as a bit line BL. The bit line layer 52 is connected to the drain-side columnar semiconductor layer 86 via the drain-side contact plug layer 89 and the silicide layer 92.

(Manufacturing Process of the Non-volatile Semiconductor Memory Device 100 According to the Second Embodiment)

Next, the manufacturing process of the drain-side selection transistor layer 80 of a non-volatile semiconductor memory device according to the present embodiment will be described with reference to FIG. 17 to FIG. 22. FIG. 17 to FIG. 22 are sectional views showing the drain-side selection transistor layer 80 in the manufacturing process of a non-volatile semiconductor memory device according to the present embodiment. Here, the manufacturing process of a non-volatile semiconductor memory device according to the present embodiment is the same as that in the first embodiment up to etching of the polysilicon film 69 shown in FIG. 9.

Figure 17:
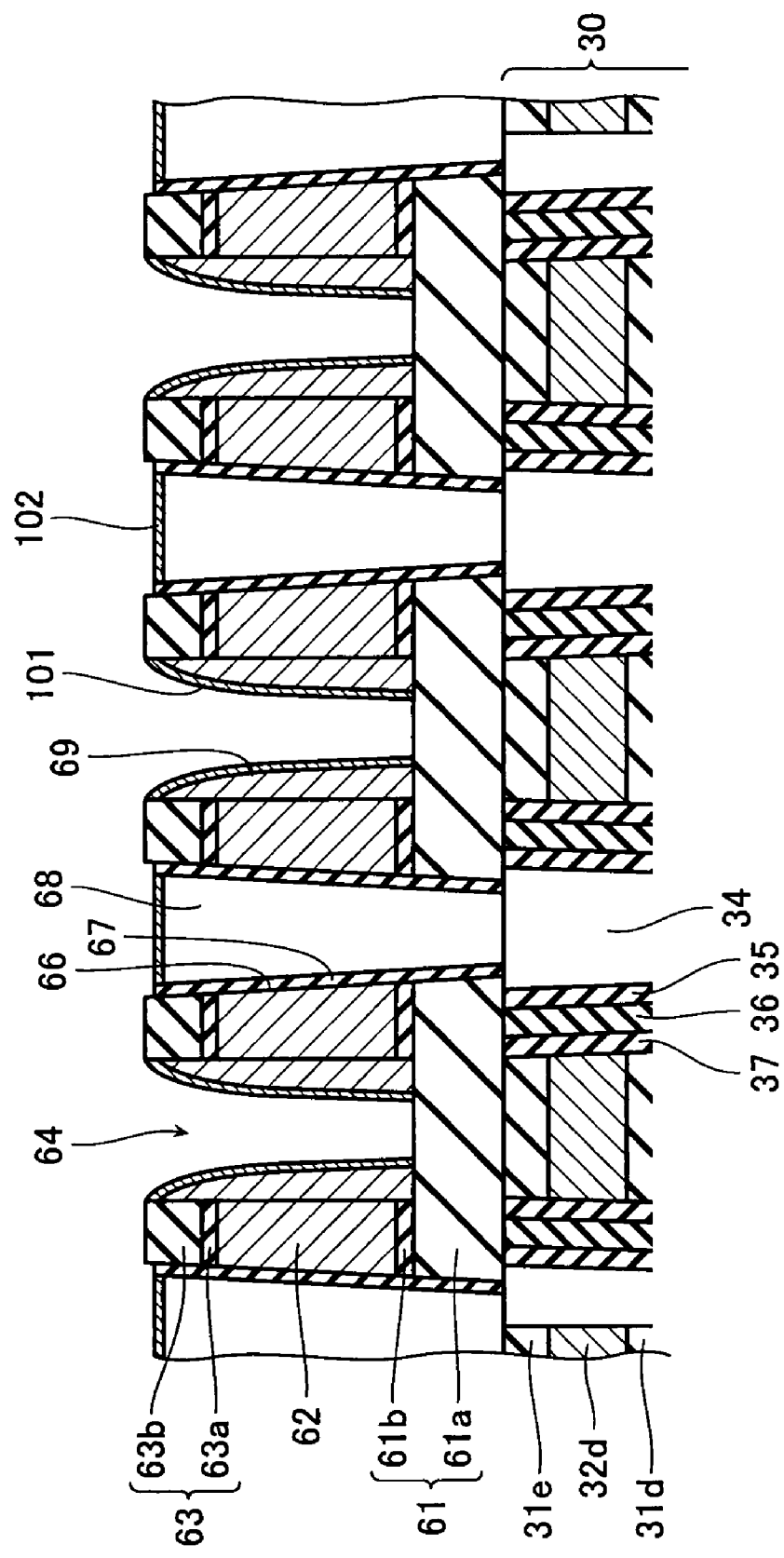
FIG. 17 is a sectional view showing a manufacturing process of the non-volatile semiconductor memory device 100 according to the second embodiment.

As shown in FIG. 17, a metal film of, for example, titanium (Ti), cobalt (Co), or nickel (Ni) is deposited on the entire surface of the drain-side selection transistor layer 80 including the etched surface of the polysilicon film 69 and the drain-side columnar semiconductor layer 68 by sputtering or the CVD (Chemical Vapor Deposition) method. Then, silicide layers 101 and 102 are self-alignigly formed on the surface of the polysilicon film 69 and the drain-side columnar semiconductor layer 68 by adding heat (salicide process). Then, the metal film not silicified on the silicon nitride film 61a and the silicon nitride film 63b is removed by cleaning. The silicide layers 101 and 102 will become the silicide layers 90 and 92 after processes shown later.

Figure 18:
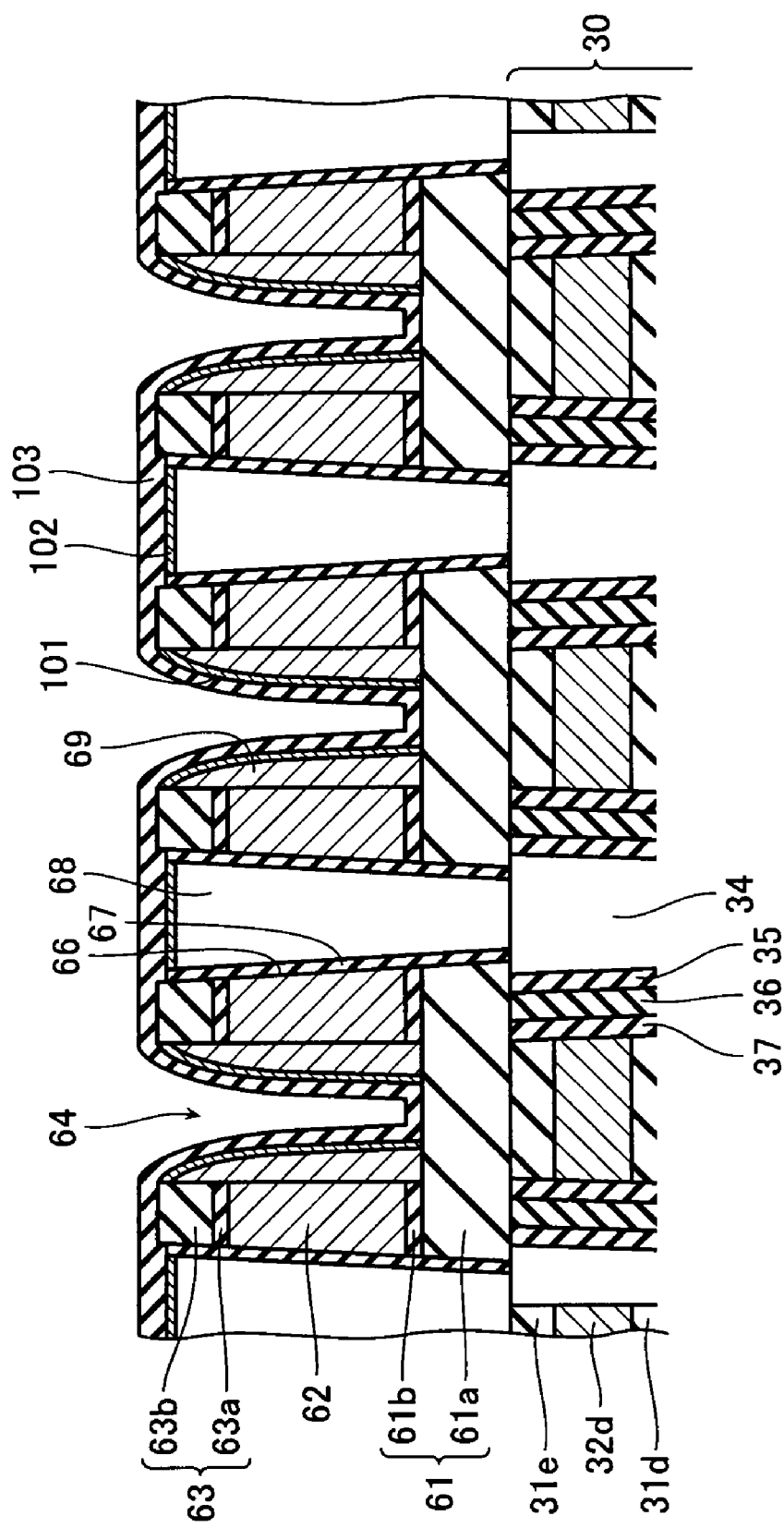
FIG. 18 is a sectional view showing a manufacturing process of the non-volatile semiconductor memory device 100 according to the second embodiment.

Next, as shown in FIG. 18, a silicon nitride film 103 is deposited on the entire surface of the drain-side selection transistor layer 80 including the surface of the silicide layer 101 and the silicide layer 102. The silicon nitride film 103 will become the insulating layer 91 after processes shown later.

Figure 19:
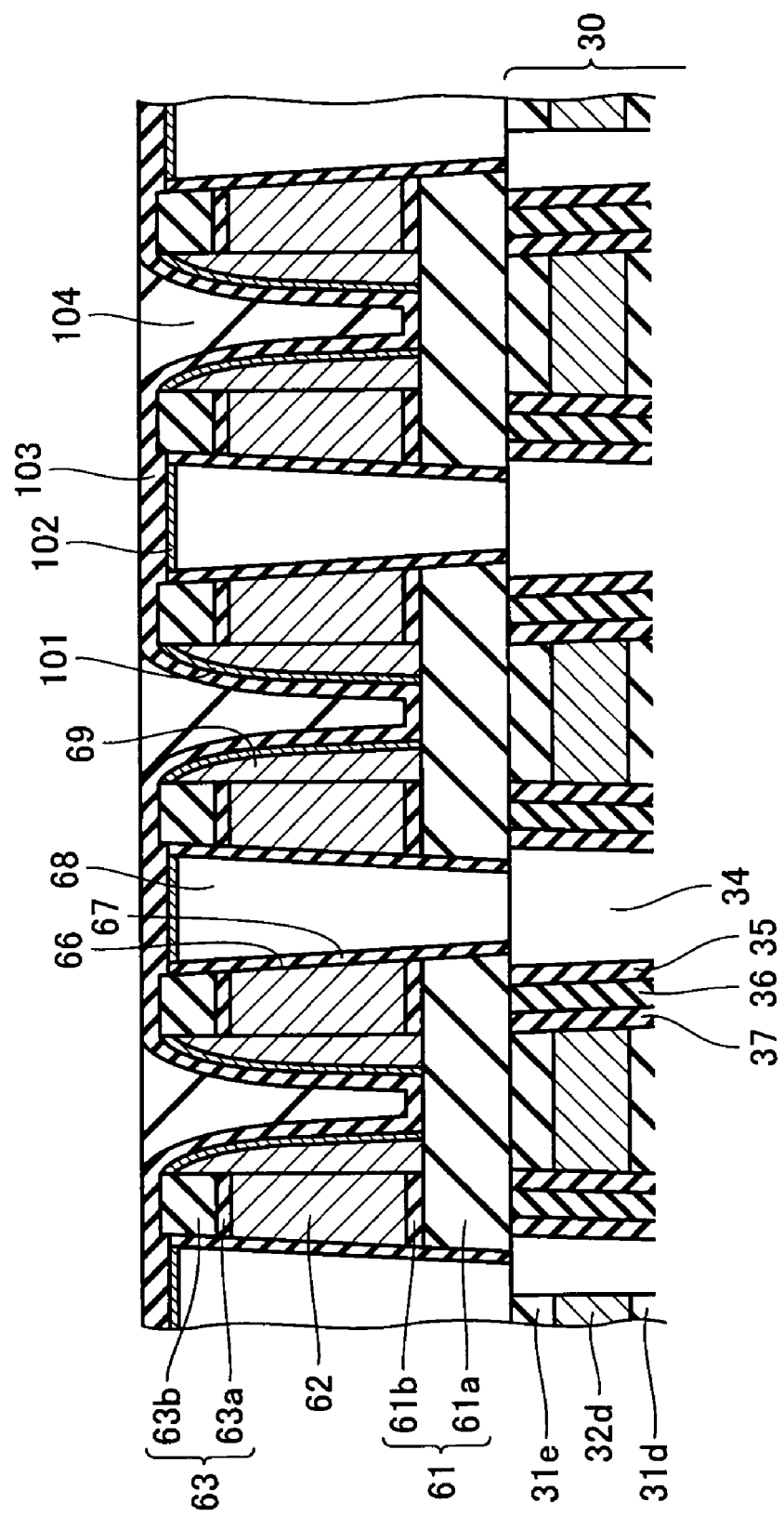
FIG. 19 is a sectional view showing a manufacturing process of the non-volatile semiconductor memory device 100 according to the second embodiment.

Next, as shown in FIG. 19, a silicon oxide film 104 is deposited on the entire surface of the drain-side selection transistor layer 80 including the inside of the selection transistor separation trench 64 and then, the surface thereof is planarized by the CMP (Chemical Mechanical Polishing) method. The selection transistor separation trench 64 is thereby filled up with the silicon oxide film 104.

Figure 20:
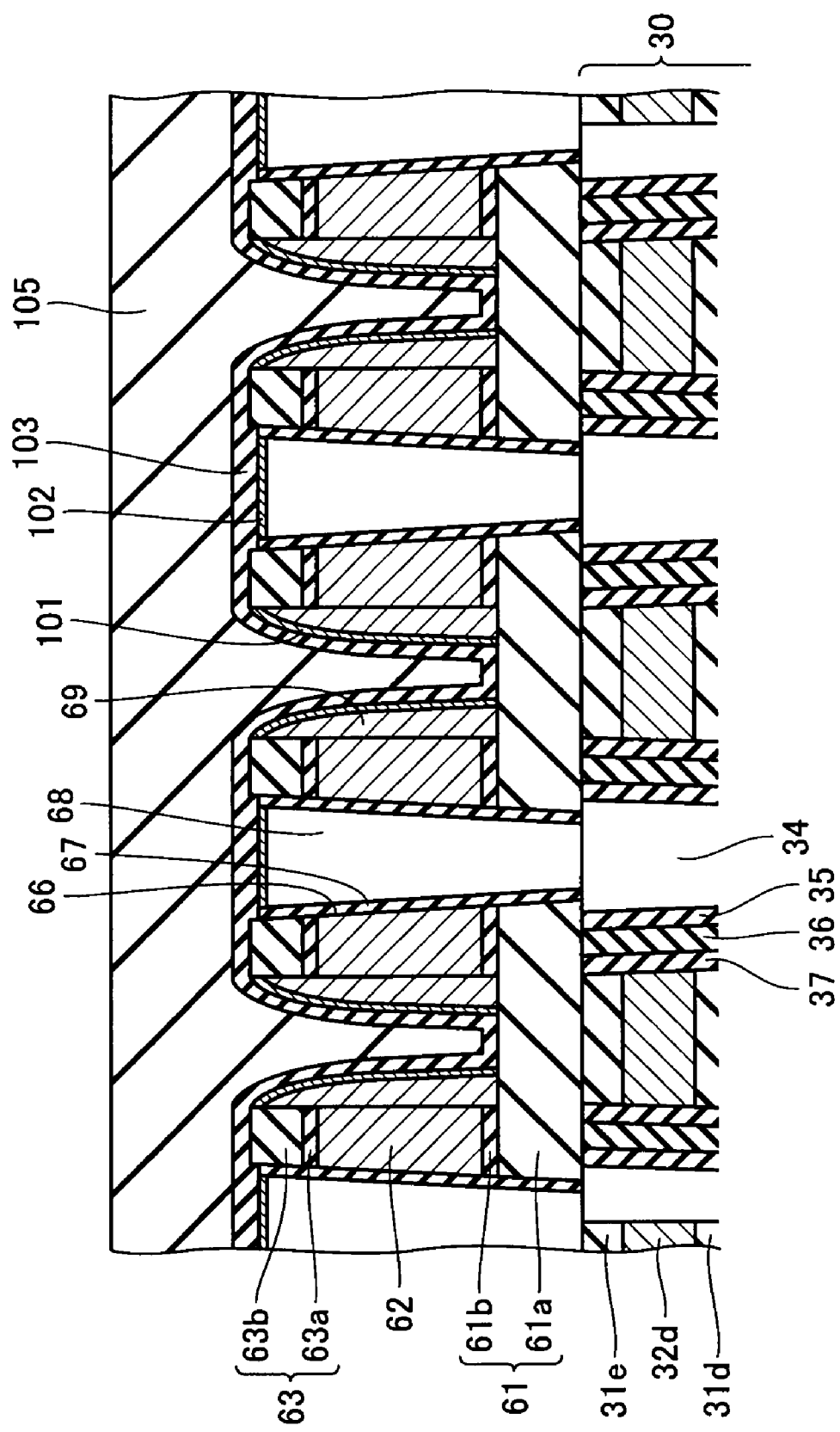
FIG. 20 is a sectional view showing a manufacturing process of the non-volatile semiconductor memory device 100 according to the second embodiment.

Next, as shown in FIG. 20, a silicon oxide film 105 is further deposited on the silicon oxide film 104. The silicon oxide film 105 will become the interlayer insulating layer 84 after processes shown later.

Figure 21:
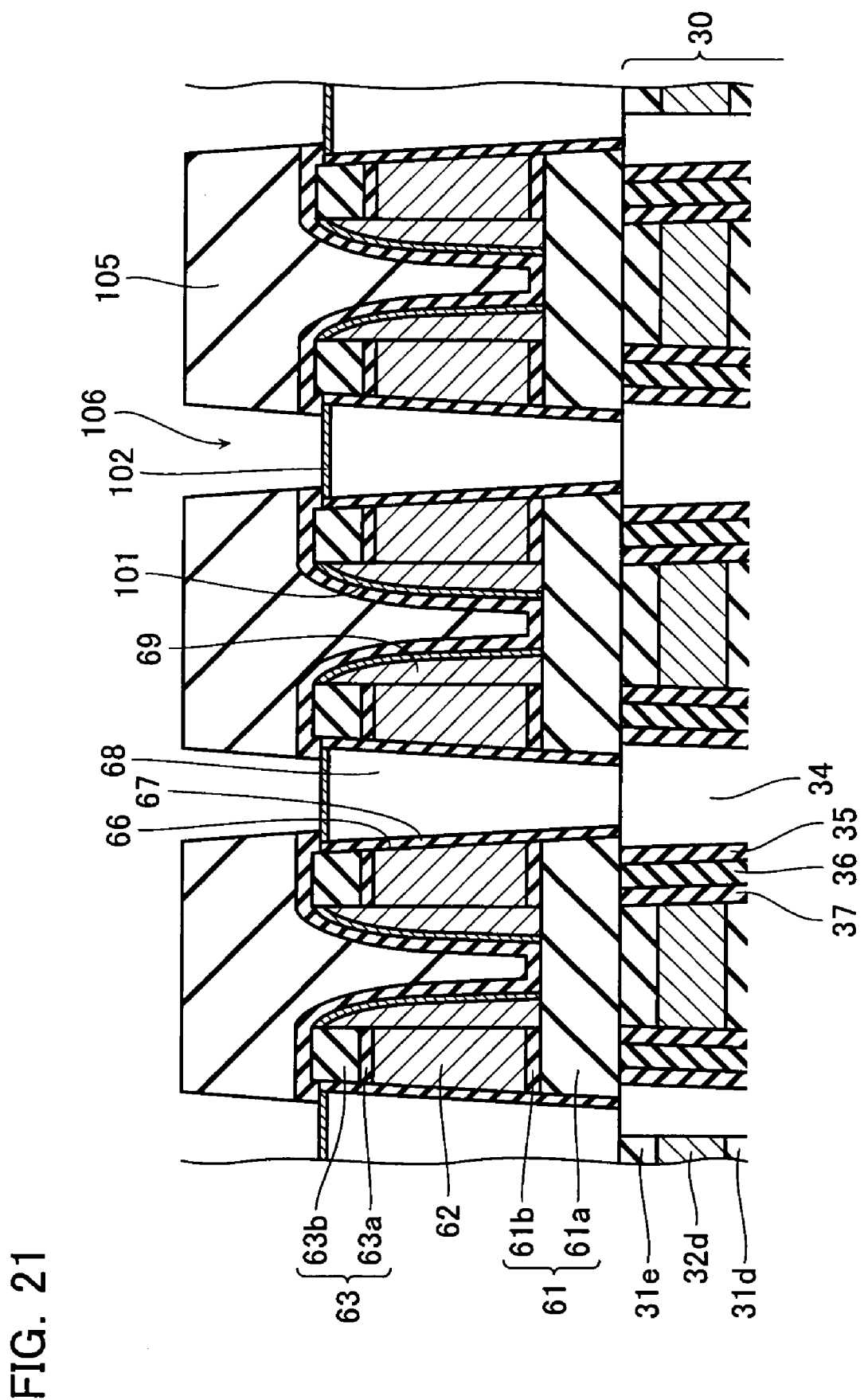
FIG. 21 is a sectional view showing a manufacturing process of the non-volatile semiconductor memory device 100 according to the second embodiment.

Next, as shown in FIG. 21, a hole 106 for a drain-side contact plug layer is formed so as to reach the silicide layer 102 on the drain-side columnar semiconductor layer 68 by penetrating the silicon oxide film 105 and the silicon nitride film 103.

Figure 22:
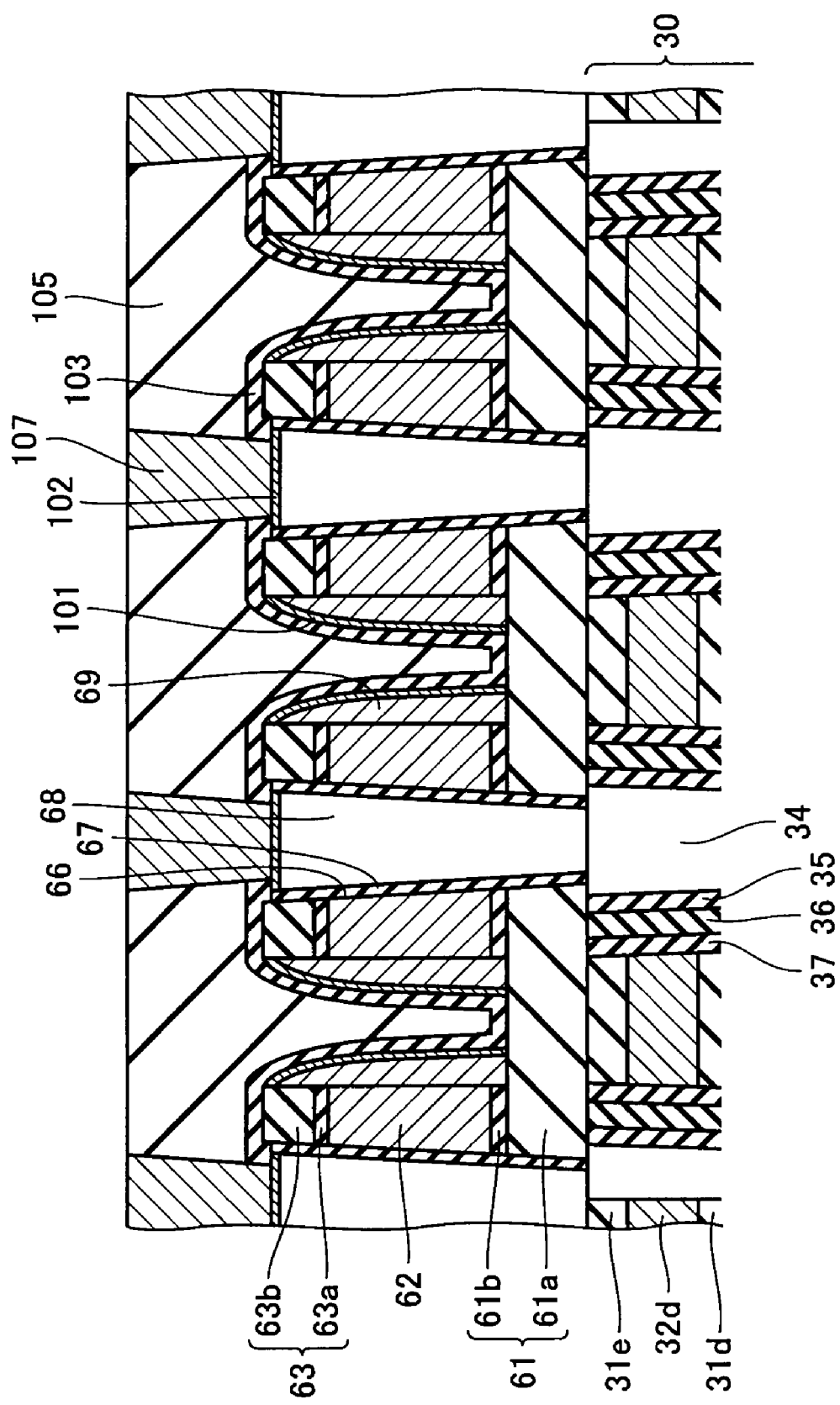
FIG. 22 is a sectional view showing a manufacturing process of the non-volatile semiconductor memory device 100 according to the second embodiment.

Next, as shown in FIG. 22, after, for example, tungsten (W) being deposited inside the hole 106, the surface is planarized to form a drain-side contact plug layer 107. Then, the bit line layer 52 to be a bit line is formed by being in contact with the drain-side contact plug layer 107. The bit line layer 52 is formed, for example, from tungsten (W). In this manner, the drain-side selection transistor layer 80 of a non-volatile semiconductor memory device according to the second embodiment can be formed.

(Effects of the Non-volatile Semiconductor Memory Device 100 According to the Second Embodiment)

Next, effects of the non-volatile semiconductor memory device 100 according to the second embodiment will be described. Also in the non-volatile semiconductor memory device 100 according to the second embodiment, the drain-side second conductive layer 88 is provided on the sidewall of the drain-side first conductive layer 82 formed in a line form. Thus, even if the drain-side columnar semiconductor layer 86 deviates from the drain-side first conductive layer 82 due, for example, to misalignment when a hole is formed, the drain-side columnar semiconductor layer 86 will be completely surrounded by the drain-side first conductive layer 82 and the drain-side second conductive layer 88 in a process of forming the drain-side second conductive layer 88. Thus, characteristics of the drain-side selection transistor SDTrmn can be made uniform.

The non-volatile semiconductor memory device according to the present embodiment also has the silicide layer 90 formed on the surface of the drain-side second conductive layer 88. Resistance of the gate electrode of the drain-side selection transistor SDTrmn and that of the drain-side selection gate line SGD can further be reduced by the silicide layer 90.

Thus, as described above, the non-volatile semiconductor memory device 100 according to the second embodiment is provided with a selection transistor whose characteristics do not disperse and having a low-resistance gate line.

(Other Embodiments)

Embodiments of the non-volatile semiconductor memory device have been described above, but the present invention is not limited to the embodiments and various modifications, additions, and replacements can be performed without deviating from the scope of the present invention.

In the first and second embodiments, for example, a selection transistor layer on which a sidewall conductive layer is formed is described as a drain-side selection transistor layer in an upper portion of a memory string MS. However, it is also possible to provide such a structure in a source-side selection transistor layer in a lower portion of the memory string MS.

Figure 23:
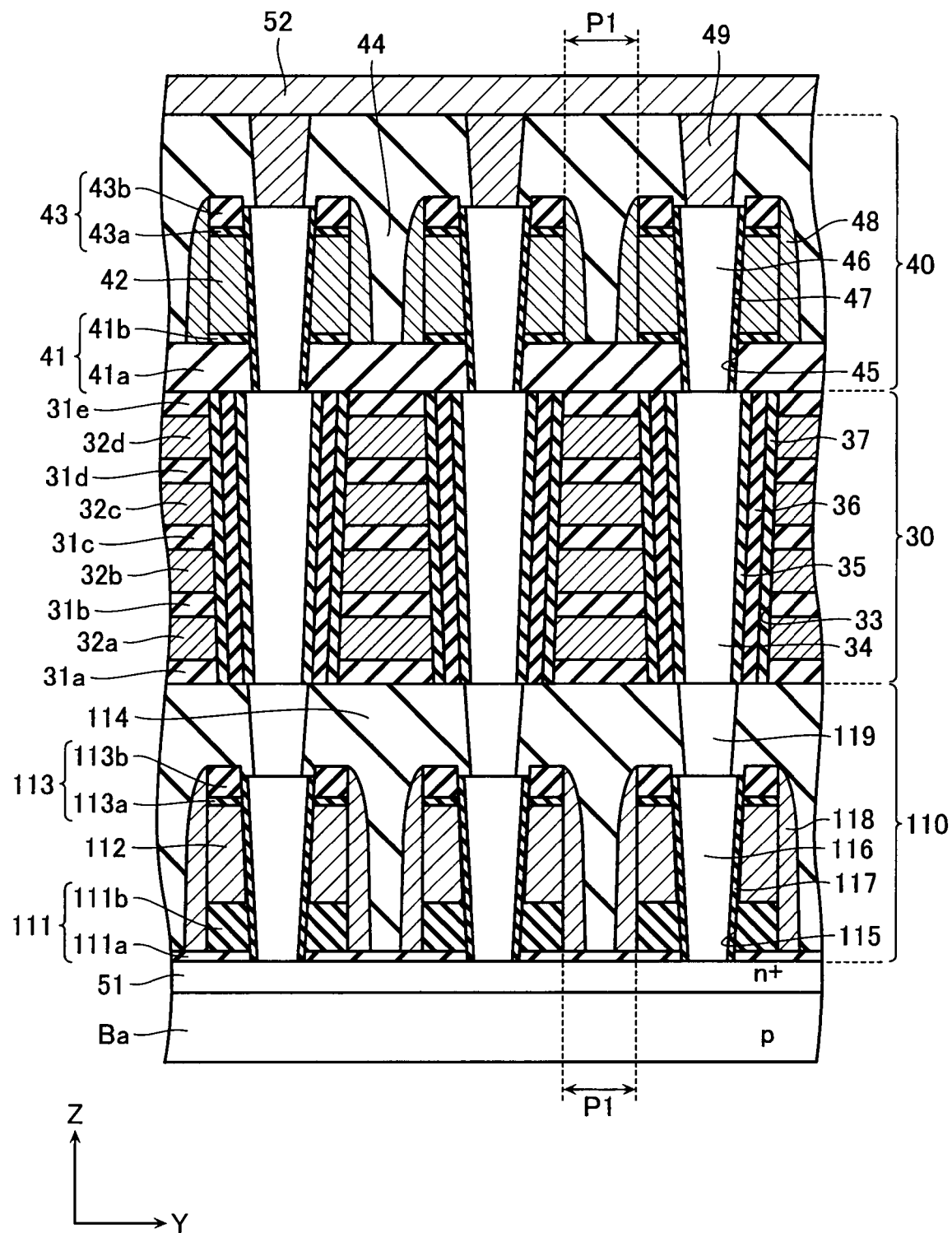
FIG. 23 is a sectional view of a memory string MS of a modified example of the first embodiment.

FIG. 23 is a sectional view of a modified memory string MS of the first embodiment. As shown in FIG. 23, the memory string MS includes a source-side selection transistor layer 110, the memory transistor layer 30, and the drain-side selection transistor layer 40 from lower layers to upper layers. The source-side selection transistor layer 110 functions as a source-side selection transistor SSTrmn. The memory transistor layer 30 functions as a memory transistor MTrmn. The drain-side selection transistor layer 40 functions as a drain-side selection transistor SDTrmn. The structure of the memory transistor layer 30 and that of the drain-side selection transistor layer 40 are similar to those in the first embodiment.

The source-side selection transistor layer 110 includes a source-side first insulating layer 111 including insulating layers 111a and 111b formed on a source line layer 51 (functioning as a source line SL) of the semiconductor substrate Ba, a source-side first conductive layer (third conductive layer) 112 formed on the top surface of the source-side first insulating layer 111, and a source-side second insulating layer 113 including insulating layers 113a and 113b formed on the top surface of the source-side first conductive layer 112. The insulating layer 111b, the source-side first conductive layer 112, and the source-side second insulating layer 113 are repeatedly provided in a line form by providing the certain interval P1 in the Y direction. A source-side second conductive layer (second sidewall conductive layer) 118 is formed on sidewalls of the insulating layer 111b, the source-side first conductive layer 112, and the source-side second insulating layer 113 that are adjacent to each other with the space of the interval P1. The source-side second conductive layer 118 is in contact with the insulating layer 111b, the source-side first conductive layer 112, and the source-side second insulating layer 113 and are formed, like the insulating layer 111b, the source-side first conductive layer 112, and the source-side second insulating layer 113, by extending in the X direction shown in FIG. 2. An interlayer insulating layer 114 is provided between the insulating layers 111b, the source-side first conductive layers 112, the source-side second insulating layers 113, and the source-side second conductive layers 118 in the Y direction.

The insulating layer 111a and the insulating layer 113b are formed, for example, from a silicon nitride (SiN) film. The insulating layer 111b, the insulating layer 113a, and the interlayer insulating layer 114 are formed, for example, from a silicon oxide ($SiO_2$) film. The source-side first conductive layer 112 and the source-side second conductive layer 118 are formed, for example, from polysilicon (p-Si). The source-side first conductive layer 112 and the source-side second conductive layer 118 function as control gate of the above source-side selection transistor SSTrmn.

The source-side selection transistor layer 110 includes a source-side hole 115 formed to penetrate the source-side first insulating layer 111, the source-side conductive layer 112, and the source-side second insulating layer 113 and a source-side columnar semiconductor layer (third columnar semiconductor layer) 116 extending in a direction perpendicular to the semiconductor substrate Ba formed inside the source-side hole 115. The source-side columnar semiconductor layer 116 is formed, for example, from polysilicon (p-Si).

Further, the source-side selection transistor layer 110 includes a source-side gate insulating layer 117 formed by being in contact with the source-side columnar semiconductor layer 116. The source-side gate insulating layer 117 is in contact with the source-side first conductive layer 112. The source-side gate insulating layer 117 is formed, for example, from a silicon oxide ($SiO_2$) film.

In the source-side selection transistor layer 110, to put the configuration of the source-side first conductive layer 112 in other words, the source-side first conductive layer 112 is formed such that the source-side gate insulating layer 117 is sandwiched between the source-side first conductive layer 112 and the source-side columnar semiconductor layer 116.

The source-side selection transistor layer 110 has a source-side contact plug layer 119 provided in such a manner that the source-side contact plug layer 119 penetrate the interlayer insulating layer 114 and reach the source-side columnar semiconductor layer 116. The memory columnar semiconductor layer 34 is connected to the upper side of the source-side selection transistor layer 110. The source-side contact plug layer 119 is formed, for example, from polysilicon (p-Si).

In this manner, the source-side second conductive layer 118 is provided on the sidewall of the source-side first conductive layer 112 of the source-side selection transistor layer 110. Thus, even if the source-side columnar semiconductor layer 116 deviates from the source-side first conductive layer 112 due, for example, to misalignment when a hole is formed, the source-side columnar semiconductor layer 116 will be completely surrounded by the source-side first conductive layer 112 and the source-side second conductive layer 118 in a process of forming the source-side second conductive layer 118. Thus, characteristics of the source-side selection transistor SSTrmn can be made uniform.

What is claimed is:

1. A non-volatile semiconductor memory device comprising:
    a plurality of memory strings in which a plurality of memory cells that are electrically rewritable and a plurality of selection transistors are connected in series,
    the plurality of memory strings comprising:
    a plurality of first conductive layers laminated in a laminating direction perpendicular to a semiconductor substrate with a plurality of first interlayer insulating layers each sandwiched therebetween, each of the first conductive layers serving as a gate electrode of each of the memory cells;
    a plurality of first holes each formed to penetrate the plurality of first conductive layers and the plurality of first interlayer insulating layers to extend in the laminating direction;
    a plurality of charge storage layers each formed on an inner wall of a respective of the first holes, the charge storage layers each serving as a charge accumulation layer of the memory cells;
    a plurality of first columnar semiconductor layers each formed in a respective of the first holes, the first columnar semiconductor layers each serving as a channel region of the memory cells;
    a plurality of second conductive layers formed over the plurality of first conductive layers, the second conductive layers each serving as a gate electrode of a selection gate transistor of each of the memory strings, the second conductive layers each being provided in a line form extending along a first direction perpendicular to the laminating direction such that each of the second conductive layers surrounds a plurality of second columnar semiconductor layers formed along the first direction;
    a plurality of second holes each formed to penetrate the second conductive layers to extend in the laminating direction and reach the upper side of the first columnar semiconductor layers;
    a plurality of insulation layers each formed on an inner wall of a respective of the second holes and serving as a gate insulating film of the selection gate transistor;
    the plurality of second columnar semiconductor layers each formed in a respective of the second holes to contact the second conductive layers via the insulation layer, the second columnar semiconductor layers being in contact with an upper side of the first columnar semiconductor layers, the second columnar semiconductor layers each serving as a channel region of the selection gate transistor;
    a plurality of first sidewall conductive layers each formed against a sidewall of each of the second conductive layers and formed to extend in the first direction, the sidewall being an outer wall apart from the inner wall of the second holes and formed in a straight line along the first direction; and
    a second interlayer insulating layer formed below the second conductive layers,
    wherein the first sidewall conductive layers are each formed also in contact with a sidewall of the second interlayer insulating layer.

2. The non-volatile semiconductor memory device according to claim 1, wherein silicide is formed on a surface of the first sidewall conductive layers.

3. The non-volatile semiconductor memory device according to claim 1, wherein the second conductive layers and the first sidewall conductive layers are formed from polysilicon.

4. The non-volatile semiconductor memory device according to claim 1, wherein silicide is formed on a surface of the second columnar semiconductor layers.

5. The non-volatile semiconductor memory device according to claim 1, further comprising:
    a plurality of third conductive layers each formed below the plurality of first conductive layers, the third conductive layers each serving as a gate electrode of a selection gate transistor of each of the memory strings, the third conductive layers each being provided in a line form extending along the first direction;
    a plurality of third holes each formed to penetrate a respective of the third conductive layers to extend in the laminating direction and reach the lower side of the first columnar semiconductor layers;
    a plurality of second insulation layers each formed on an inner wall of a respective of the third holes and each serving as a gate insulating film of the selection gate transistor;
    a plurality of third columnar semiconductor layers each formed in a respective of the third holes to contact the third conductive layers via the second insulation layer, the third columnar semiconductor layers being in contact with a lower side of the first columnar semiconductor layers, the third columnar semiconductor layers each serving as a channel region of the selection gate transistor such that each of the third conductive layers surrounds a plurality of the third columnar semiconductor layers formed along the first direction; and a plurality of second sidewall conductive layers each formed against a sidewall of each of the third conductive layers and formed to extend in the first direction, the sidewall being formed in a straight line along the first direction.

6. A non-volatile semiconductor memory device comprising:
   a plurality of memory strings in which a plurality of memory cells that are electrically rewritable and a plurality of selection transistors are connected in series, the plurality of memory strings comprising:
   a plurality of first conductive layers laminated in a laminating direction perpendicular to a semiconductor substrate with a plurality of first interlayer insulating layers each sandwiched therebetween, each of the first conductive layers serving as a gate electrode of each of the memory cells;
   a plurality of first holes each formed to penetrate the plurality of first conductive layers and the plurality of first interlayer insulating layers to extend in the laminating direction;
   a plurality of charge storage layers each formed on an inner wall of a respective of the first holes, the charge storage layers each serving as a charge accumulation layer of the memory cells;
   a plurality of first columnar semiconductor layers each formed in a respective of the first holes, the first columnar semiconductor layers each serving as a channel region of the memory cells;
   a plurality of second conductive layers formed over the plurality of first conductive layers, the second conductive layers each serving as a gate electrode of a selection gate transistor of each of the memory strings, the second conductive layers each being provided in a line form extending along a first direction perpendicular to the laminating direction such that each of the second conductive layers surrounds a plurality of second columnar semiconductor layers formed along the first direction;
   a plurality of second holes each formed to penetrate the second conductive layers to extend in the laminating direction and reach the upper side of the first columnar semiconductor layers;
   a plurality of insulation layers each formed on an inner wall of a respective of the second holes and serving as a gate insulating film of the selection gate transistor;
   the plurality of second columnar semiconductor layers each formed in a respective of the second holes to contact the second conductive layers via the insulation layer, the second columnar semiconductor layers being in contact with an upper side of the first columnar semiconductor layers, the second columnar semiconductor layers each serving as a channel region of the selection gate transistor;
   a plurality of first sidewall conductive layers each formed against a sidewall of each of the second conductive layers and formed to extend in the first direction, the sidewall being an outer wall apart from the inner wall of the second holes and formed in a straight line along the first direction; and
   a second interlayer insulating layer formed above the second conductive layers,
   wherein the first sidewall conductive layers are each formed also in contact with a sidewall of the second interlayer insulating layer.

7. The non-volatile semiconductor memory device according to claim 6, wherein the second interlayer insulating layer is formed of a plurality of laminated interlayer insulating layers, and
   the first sidewall conductive layers are each formed in contact with all sidewalls of the plurality of laminated interlayer insulating layers.

8. A non-volatile semiconductor memory device comprising:
   a plurality of memory strings in which a plurality of memory cells that are electrically rewritable and a plurality of selection transistors are connected in series, the plurality of memory strings comprising:
   a plurality of first conductive layers laminated in a laminating direction perpendicular to a semiconductor substrate with a plurality of first interlayer insulating layers each sandwiched therebetween, each of the first conductive layers serving as a gate electrode of each of the memory cells;
   a plurality of first holes each formed to penetrate the plurality of first conductive layers and the plurality of first interlayer insulating layers to extend in the laminating direction;
   a plurality of charge storage layers each formed on an inner wall of a respective of the first holes, the charge storage layers each serving as a charge accumulation layer of the memory cells;
   a plurality of first columnar semiconductor layers each formed in a respective of the first holes, the first columnar semiconductor layers each serving as a channel region of the memory cells;
   a plurality of second conductive layers formed below the plurality of first conductive layers, the second conductive layers each serving as a gate electrode of a selection gate transistor of each of the memory strings, the second conductive layers each being provided in a line form extending along a first direction perpendicular to the laminating direction such that each of the second conductive layers surrounds a plurality of second columnar semiconductor layers formed along the first direction;
   a plurality of second holes each formed to penetrate the second conductive layers to extend in the laminating direction and reach the lower side of the first columnar semiconductor layers;
   a plurality of insulation layers each formed on an inner wall of a respective of the second holes and serving as a gate insulating film of the selection gate transistor;
   the plurality of second columnar semiconductor layers each formed in a respective of the second holes to contact the second conductive layers via the insulation layer, the second columnar semiconductor layers being in contact with a side of the first columnar semiconductor layers, the second columnar semiconductor layers each serving as a channel region of the selection gate transistor;
   a plurality of first sidewall conductive layers each formed against a sidewall of each of the second conductive layers and formed to extend in the first direction, the sidewall being an outer wall apart from the inner wall of the second holes and formed in a straight line along the first direction; and
   a second interlayer insulating layer formed below the second conductive layers, wherein the first sidewall conductive layers are each formed also in contact with a sidewall of the second interlayer insulating layer.

9. The non-volatile semiconductor memory device according to claim 8, wherein the first conductive layers and the second sidewall conductive layer are formed from polysilicon.

10. A non-volatile semiconductor memory device comprising:

a plurality of memory strings in which a plurality of memory cells that are electrically rewritable and a plurality of selection transistors are connected in series, the plurality of memory strings comprising:

a plurality of first conductive layers laminated in a laminating direction perpendicular to a semiconductor substrate with a plurality of first interlayer insulating layers each sandwiched therebetween, each of the first conductive layers serving as a gate electrode of each of the memory cells;

a plurality of first holes each formed to penetrate the plurality of first conductive layers and the plurality of first interlayer insulating layers to extend in the laminating direction;

a plurality of charge storage layers each formed on an inner wall of a respective of the first holes, the charge storage layers each serving as a charge accumulation layer of the memory cells;

a plurality of first columnar semiconductor layers each formed in a respective of the first holes, the first columnar semiconductor layers each serving as a channel region of the memory cells;

a plurality of second conductive layers formed below the plurality of first conductive layers, the second conductive layers each serving as a gate electrode of a selection gate transistor of each of the memory strings, the second conductive layers each being provided in a line form extending along a first direction perpendicular to the laminating direction such that each of the second conductive layers surrounds a plurality of second columnar semiconductor layers formed along the first direction;

a plurality of second holes each formed to penetrate the second conductive layers to extend in the laminating direction and reach the lower side of the first columnar semiconductor layers;

a plurality of insulation layers each formed on an inner wall of a respective of the second holes and serving as a gate insulating film of the selection gate transistor;

the plurality of second columnar semiconductor layers each formed in a respective of the second holes to contact the second conductive layers via the insulation layer, the second columnar semiconductor layers being in contact with a side of the first columnar semiconductor layers, the second columnar semiconductor layers each serving as a channel region of the selection gate transistor;

a plurality of first sidewall conductive layers each formed against a sidewall of each of the second conductive layers and formed to extend in the first direction, the sidewall being an outer wall apart from the inner wall of the second holes and formed in a straight line along the first direction; and a second interlayer insulating layer formed above the second conductive layers, wherein the first sidewall conductive layers are each formed also in contact with a sidewall of the second interlayer insulating layer.

11. The non-volatile semiconductor memory device according to claim 10, wherein the second interlayer insulating layer is formed of a plurality of laminated interlayer insulating layers, and the first sidewall conductive layers are formed in contact with all sidewalls of the plurality of laminated interlayer insulating layers.

* * * * *